US008782570B1

(12) United States Patent
Li et al.

(10) Patent No.: US 8,782,570 B1
(45) Date of Patent: Jul. 15, 2014

(54) METHODS, SYSTEMS, AND ARTICLES OF MANUFACTURE FOR IMPLEMENTING A PHYSICAL ELECTRONIC CIRCUIT DESIGN WITH MULTIPLE-PATTERNING TECHNIQUES

(75) Inventors: Jianmin Li, Los Gatos, CA (US); Jing Chen, Fremont, CA (US); Guowei Zhao, Jiangsu (CN); Taufik Arifin, Santa Clara, CA (US); Yuan Huang, Redwood City, CA (US); Soohong A. Kim, Pleasanton, CA (US); Vassilios Gerousis, San Jose, CA (US); Shuo Zhang, Fremont, CA (US); Dahe Chen, Metuchen, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/465,917

(22) Filed: May 7, 2012

(51) Int. Cl.
 *G06F 17/50* (2006.01)
(52) U.S. Cl.
 USPC ............................................. 716/52; 716/51
(58) Field of Classification Search
 USPC ...................................... 716/50–54
 See application file for complete search history.

(56) References Cited

U.S. PATENT DOCUMENTS

| 7,823,102 | B2 * | 10/2010 | Chandra et al. ............... 716/106 |
| 8,209,656 | B1 | 6/2012 | Wang et al. |
| 8,296,717 | B1 | 10/2012 | O'riordan |
| 8,364,452 | B2 | 1/2013 | Mitsuhashi |
| 8,375,348 | B1 | 2/2013 | Raj et al. |
| 8,429,574 | B2 | 4/2013 | Cao et al. |
| 8,465,103 | B2 | 6/2013 | Burt et al. |
| 8,473,874 | B1 | 6/2013 | Sharma et al. |
| 8,495,548 | B2 * | 7/2013 | Agarwal et al. ............... 716/122 |
| 8,516,402 | B1 * | 8/2013 | Wang ............................... 716/52 |
| 8,516,404 | B1 | 8/2013 | Cao et al. |
| 8,549,458 | B2 | 10/2013 | Sezginer |
| 8,560,998 | B1 | 10/2013 | Salowe et al. |
| 8,595,662 | B1 | 11/2013 | Yu et al. |
| 8,619,786 | B2 | 12/2013 | Wentink |
| 8,645,902 | B1 | 2/2014 | Yu et al. |
| 2011/0014786 | A1 * | 1/2011 | Sezginer et al. ............... 438/618 |
| 2011/0219341 | A1 | 9/2011 | Cao et al. |
| 2013/0191793 | A1 | 7/2013 | Cao et al. |

OTHER PUBLICATIONS

U.S. Appl. No. 13/602,071, filed Aug. 31, 2012.

* cited by examiner

*Primary Examiner* — Binh Tat
(74) *Attorney, Agent, or Firm* — Vista IP Law Group, LLP

(57) ABSTRACT

Various embodiments identify some constraints for multiple mask designs of multi-patterning lithography processes for manufacturing an electronic design and colors multiple routing tracks in a layer of the electronic design with certain colors. These embodiments color fixed object(s) in the design with one or more of these certain colors based on coloring of the multiple routing tracks. Some embodiments further color movable object(s) based on results of coloring the fixed object (s) or coloring routing track(s). Some embodiments route the physical design with coloring of fixed object(s), coloring of movable object(s), or routing connectivity. Multiple-patterning conflicts may be detected based on the coloring of fixed object(s), coloring of movable object(s), or routing connectivity. Some embodiments route with search-and-repair strategy(ies) to improve or resolve conflict(s). Some embodiments color objects upon their creation, and the layout is thus multiple-patterning design rule clean as constructed.

34 Claims, 19 Drawing Sheets

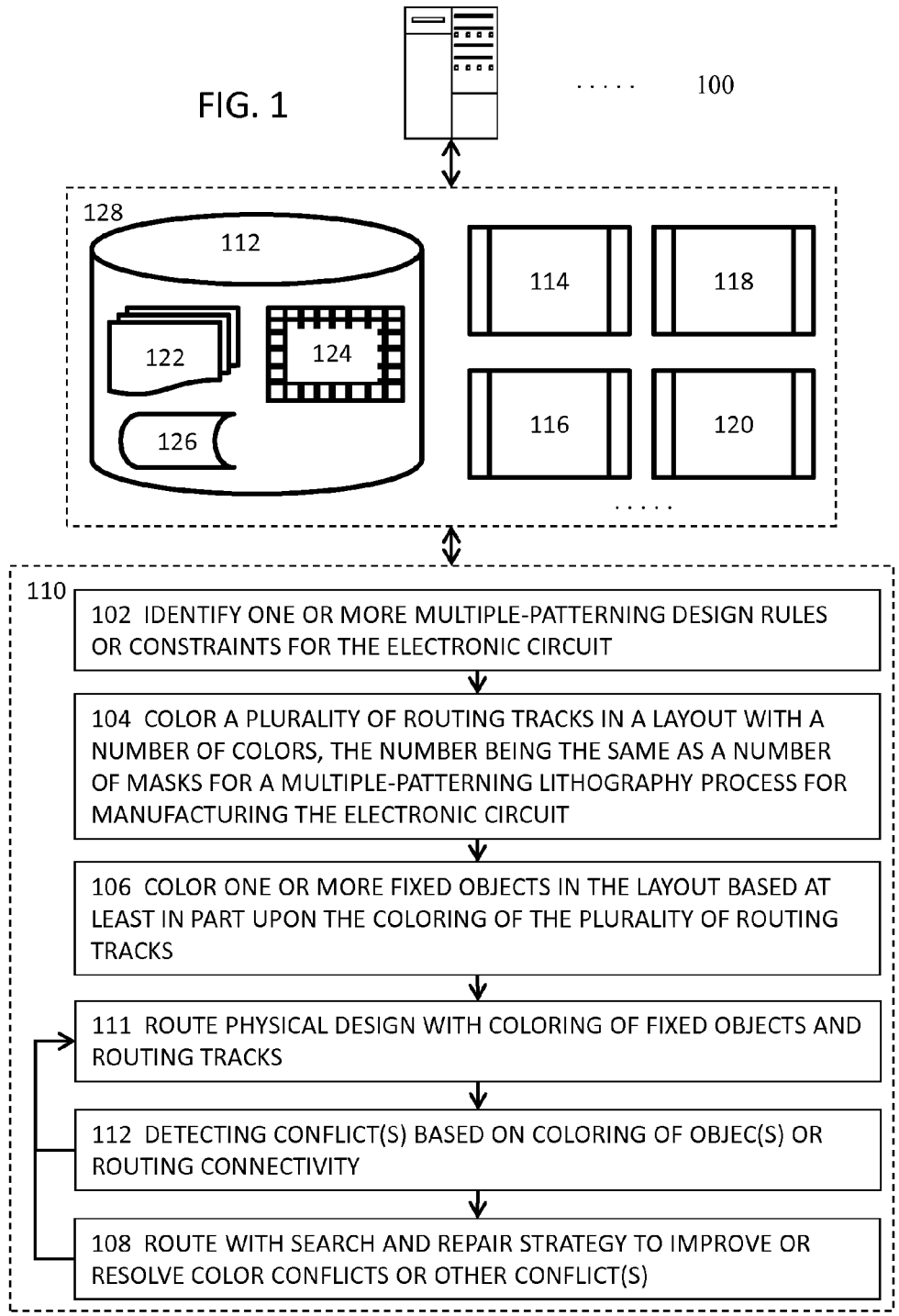

US 8,782,570 B1

METHODS, SYSTEMS, AND ARTICLES OF MANUFACTURE FOR IMPLEMENTING A PHYSICAL ELECTRONIC CIRCUIT DESIGN WITH MULTIPLE-PATTERNING TECHNIQUES

BACKGROUND

Deep sub-wavelength lithography, i.e., using the 193 nm lithography to print feature sizes/densities (e.g., for 45 nm, 32 nm, 22 nm nodes) much smaller than the wavelength (193 nm), is one of the most fundamental challenges for the nanometer CMOS scaling. Many intriguing techniques have been developed to push the limit of the 193 nm lithography, from immersion lithography to computational lithography. Nonetheless, even with these exotic techniques, the single patterning 193 nm lithography is approaching its physical limit around the 22 nm node. On the other hand, the so-called next generation lithography (NGL), including extreme ultra-violet (EUV) lithography, nano-imprint lithography (NIL), multiple e-beam direct-write (MEBDW) may still be not ready for 22 nm or perhaps even smaller nodes (e.g., 16 nm and 8 nm nodes) due to many technology challenges and economic challenges.

Double patterning lithography (DPL) is a natural extension to the single patterning lithography that uses two separate patterning processes to form two coarser patterns which are combined to form a single finer pattern. DPL is currently the forerunner for 32 nm, 22 nm, and even 16 nm. The paradigm of double patterning could be further extended to triple patterning lithography, and even quadruple patterning lithography.

Traditional multiple-pattern lithography requires complex, time-consuming mask splitting processes to split a completed physical electronic design into multiple mask designs.

Thus, there exists a need for a method, a system, and an article of manufacture for implementing a physical electronic circuit design with multiple-patterning technique awareness.

SUMMARY

Disclosed are method(s), system(s), and article(s) of manufacture for implementing a physical electronic circuit design with multiple-patterning technique awareness. Various embodiments identify some constraints for a plurality of mask designs of one or more multi-patterning lithography processes for manufacturing an electronic design. These embodiments further colors a plurality of routing tracks in a layer of the electronic design with a first number of colors. The first number of colors is identical to the number of mask designs that are used to manufacture the layer of the electronic design. These embodiments further color one or more fixed objects in the electronic design with one or more of the first number of colors based at least in part on the coloring of the plurality of routing tracks. Some of these embodiments route at least a portion of the physical design based at least in part upon the coloring or mask identifications of the one or more fixed objects and the coloring or mask identifications of the plurality of routing tracks. In these embodiments, the method uses the coloring or mask identifications of the one or more fixed objects and the coloring or mask identifications of the plurality of routing tracks as guidance for routing the at least a portion of the physical design.

Some embodiments further color one or more movable objects (e.g., an interconnect) based at least in part on results of coloring the one or more fixed objects. In addition, the method detects one or more conflicts, such as one or more color conflicts, one or more mask conflicts, or a combination thereof, based at least in part upon the coloring of the one or more fixed objects, the coloring of the one or more movable objects, or routing connectivity in some embodiments. Various embodiments color the one or more fixed objects and the one or more movable objects to reduce or minimize color conflict. The method may also perform routing with, for example, one or more search and repair strategies, to improve or resolve one or more color conflicts or one or more other conflicts in some embodiments. In some embodiments, a process of minimizing color conflict comprises a process of reducing the extent of a conflict between the mask identification of a routing track and that of a physical design object, which occupies at least a part of the routing track. In some other embodiments, a process of minimizing color conflict comprises a process of reducing the extent of a conflict between the mask identification of a first physical design object and that of a second physical design object that may be connected together. In these two sets of embodiments, the process of minimizing color conflict effectively localizes the color conflict from a global concern to a local extent as indicated by the reduced extent of conflict.

Some embodiments utilize an objective function to reduce or minimize color conflict between the color of an object and the color of its one or more underlying routing tracks, at least a part of which is occupied by the object. Some embodiments color various objects as these various objects are being created in a physical design, and the physical design is thus multiple-patterning clean and satisfies various multiple-patterning lithography constraints as the physical design is being created. Some embodiments further employ different, independent coloring schemes for different layers such that the coloring of the routing tracks and objects on a first layer is independent and separate from the coloring of routing tracks and objects on a second layer. In various embodiments, a color of an object or a routing track includes an identification of a mask design with which the object is associated, and to color an object or a routing track comprises an action of identifying or associating the object or the routing track with a particular mask design of a plurality of mask designs for multiple-patterning lithography processes that are to be used to manufacture the electronic circuit according to its design.

In some embodiments, the process for reducing color conflict may further include the sub-process of identifying an object from one or more fixed objects that exhibits color conflict, and the sub-process of identifying or determining a characteristic of the object. An example of the characteristic may include, for example but not limited to, the parallel run-length of at least a portion of the object associated with a color that is different from the color of one or more underlying routing tracks, at least a part of which is occupied by the object. The characteristic may comprise a linear length of the at least the portion of the object in some embodiments. The characteristic may comprise an area of the at least the portion of the object in some other embodiments. The process for reducing color conflict may further include the sub-process of identifying or determining an objective function for the color conflict based at least in part upon the characteristic or upon one or more factors and the sub-process of reducing the color conflict by using at least the objective function.

In some embodiments, the physical design of the electronic circuit may contain only a partial, incomplete design that contains only zero or more objects. In these embodiments, the physical design is multiple-pattern clean by complying with various multiple-patterning constraints as the physical design is being created. In some embodiments, the method identifies such a partial, incomplete design by including the process of identifying connectivity information or data from a schematic design of the electronic design, the process of identifying or creating the at least one object upon which the physical design process is to be performed, the process of identifying one or more nets from the connectivity information or data for the at least one object upon which the physical design process is to be performed, and the process of identifying one or more other objects for the at least one object with a range of influence.

Some embodiments color the plurality of routing tracks by perform a process that includes the sub-process of identifying the first plurality of routing tracks on a first layer of the electronic design, the sub-process of identifying or determining one or more first constraints between two or more adjacent objects that occupy at least a part of the first plurality of routing tracks, the sub-process of identifying a first number of mask designs for manufacturing the first layer of the electronic design with the multiple-patterning lithography process, the sub-process of dividing the first plurality of routing tracks into a first number of sets of routing tracks, wherein the first number of mask designs is identical to the first number of sets, and the sub-process of associating a first set of the first number of sets of routing tracks with a first unique mask identification.

In some embodiments where the method performs the action of associating the first set of the first number of sets of routing tracks with the unique mask identification, the method may further comprise the process of identifying or creating a second plurality of routing tracks on a second layer, the process of identifying or determining the one or more first constraints or one or more second constraints between two or more adjacent objects that occupy at least a part of the second plurality of routing tracks on the second layer, the process of identifying a second number of mask designs that are to be used for manufacturing the second layer of the electronic design, the process of dividing the second plurality of routing tracks into a second number of sets, wherein the second number of mask designs is identical to the second number of sets, and the process of associating a second set of the second number of sets of routing tracks with a second unique mask identification. In some embodiments, coloring the routing tracks and objects on a first layer may be done in a completely independent manner from coloring the routing tracks and objects in a second layer.

In some embodiments where the method performs the action of coloring one or more fixed objects in an electronic design, the method may further comprise the process of identifying or creating one or more fixed objects in the electronic design, the process of identifying or determining one or more corresponding mask identifications for the one or more fixed objects, wherein the one or more corresponding mask identifications for the one or more fixed objects are fixed, the process of identifying or creating a first fixed object from the one or more fixed objects and a corresponding first mask identification for the first fixed object, the process of determining whether the corresponding first mask identification is to be altered, and the process of associating a different mask identification with the first fixed object based at least in part upon a result of the action of determining whether the corresponding first mask identification is to be altered.

In some embodiments where the method performs the action of coloring one or more movable objects in an electronic design, the method may further comprise the process of identifying or creating a movable object of the one or more movable objects in the electronic design, the process of identifying or generating one or more routing tracks related to the movable object, the process of identifying or determining one or more corresponding mask identifications of the one or more routing tracks, the process of identifying or determining an objective function based at least in part upon one or more factors, and the process of associating the movable object with a mask identification by using at least the objective function and the one or more corresponding mask identifications of the one or more routing tracks.

The method may further comprise the process of resolving a conflict between the color conflict and a constraint violation in some embodiments. In some of these embodiments, the method may further include the process of associating the color conflict with a first weight and the constraint violation with a second weight, the process of identifying or determining a repair strategy, the process of adjusting the repair strategy based at least in part upon the first weight and the second weight, and the process of modifying the electronic design based at least in part upon the repair strategy that is adjusted. In some embodiments, the method may further determines whether a common solution to the color conflict and the constraint violation exists and then adjusts a repair strategy based at least in part upon the common solution, if such a solution exists. Various details of any of the processes or sub-processes are further provided in the Detailed Description section below.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 1 illustrates a high level block diagram for a system for implementing a physical electronic circuit design with multiple-patterning technique awareness in some embodiments.

DETAILED DESCRIPTION

Figure 2A:
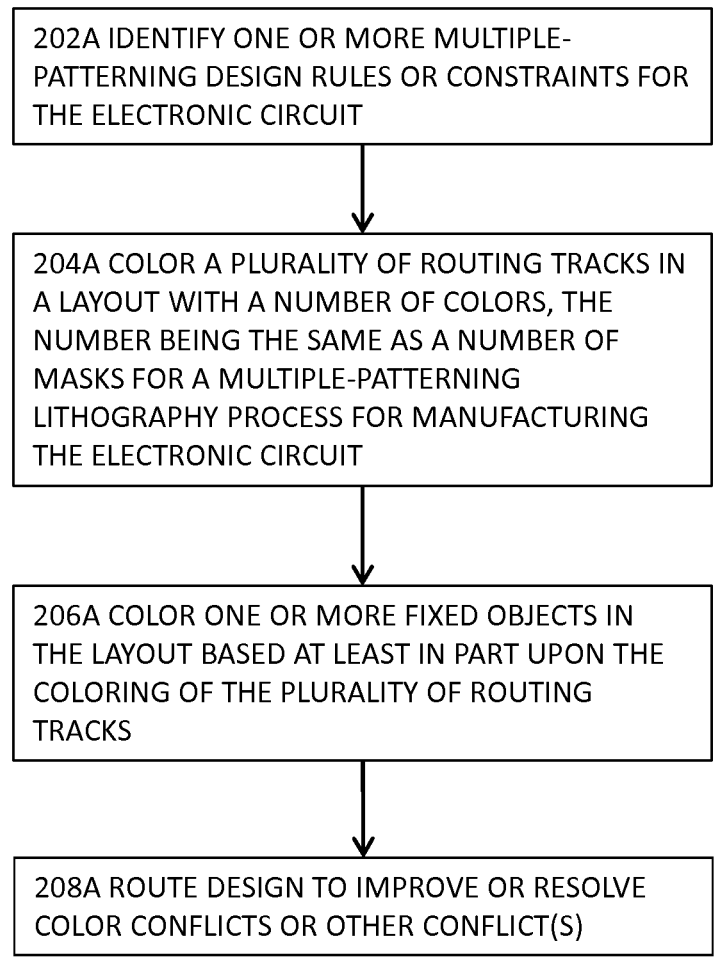
FIG. 2A illustrates a high level flow diagram for a method or a system for implementing a physical electronic circuit design with multiple-patterning technique awareness in some embodiments.

Various embodiments of the invention are directed to a methods, systems, and articles of manufacture for implementing a physical electronic design with multiple-patterning techniques. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for implementing a physical electronic circuit design with multiple-patterning techniques. Various embodiments identify some constraints for multiple mask designs of multi-patterning lithography processes for manufacturing an electronic design and colors multiple routing tracks in a layer of the electronic design with certain colors. These embodiments color fixed object(s) in the design with one or more of these certain colors based on coloring of the multiple routing tracks. Some embodiments further color movable object(s) based at least in part on results of coloring the fixed object(s), coloring of the multiple routing tracks, or routing connectivity, which may be provided by, for example but not limited to, netlists, etc. Various embodiments color fixed object(s) and movable object(s) to reduce or minimize color conflict. Some embodiments color objects as these objects are being created in a layout, and the layout is thus multiple-patterning clean. Some embodiments employ different, independent coloring schemes for different layers. Various details about any of the processes or modules are provided below in the description of figures with reference to the respective figures.

FIG. 1 illustrates a high level block diagram for a method or a system for implementing a physical electronic design with multiple-patterning techniques in some embodiments. In one or more embodiments, a designer may utilize one or more electronic design automation tools provided by one or more computing systems 100 to perform various processes or to invoke various hardware modules to implement a physical electronic design with multiple-patterning techniques. The one or more computing systems 100 may comprise or interact with various electronic design automation tools such as, but not limited to, a schematic editor, a schematic simulator, a physical design tool, a physical design analysis engine, a design rule checker, a physical verification engine, etc.

In some embodiments, the computing system 100 may invoke various system resources such as the processor(s) or processor core(s), memory, disks, etc. The computing system 100 may also initiate or interact with other computing systems to access various resources 128 that may comprise a global routing engine 114, a detail routing engine 116, a design rule checker 118, a verification engine 120, etc. The computing system 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In various embodiments, the computing system 100 may further invoke various modules or resources to perform various actions 110. These various actions may comprise the action 102 of identifying one or more multiple-patterning design rules, constraints, requirements, or goals (collectively "constraint" hereinafter) for the electronic circuit design that is subject to multiple-patterning lithography processes. These various actions may further comprise the action 104 of coloring a plurality of routing tracks in a physical electronic design with a number of colors, where the number of colors is the same as the number of masks required for using multiple-patterning lithography processes to manufacture the electronic circuit. It shall be noted that the term "color" generally refer to an identification, indication, or association of a design entity (e.g., a shape, a routing track, an interconnect, etc.) in an electronic circuit design with a particular mask design of the electronic circuit design in some embodiments.

An example of such an identification, indication, or association may comprise representing a design in a certain color in a display interface, a flag, link, pointer, or bitmap value to indicate whether a design entity is to be placed in a certain mask design of a plurality of mask designs for the multiple-patterning lithography process. For example, the method or the system may associate a single-bit value with a design entity to indicate to which mask design of a double-patterning design the design entity belongs. Throughout this disclosure, the term "color" will thus be used to represent any method for indicating which mask design a design entity belongs. These various actions may further comprise the action 106 of coloring one or more fixed objects in the physical electronic design based at least in part upon the coloring results of the plurality of routing tracks in some embodiments.

In some embodiments, the action 106 of coloring one or more fixed objects may additionally or alternatively be based in part upon the number of colors and connectivity information. These various actions may further comprise the action 111 of performing routing on at least a portion of the physical design based at least in part upon the coloring of the one or more fixed objects or the coloring of the plurality of routing tracks in accordance with various details described in the remainder of this application. In these embodiments, the method uses the coloring or mask identifications of the one or more fixed objects and the coloring or mask identifications of the plurality of routing tracks as guidance for routing the at least a portion of the physical design. These various actions may further comprise the action 112 of detecting one or more mask conflicts or one or more color conflicts based at least in part upon the results of coloring various objects (e.g., one or more fixed objects, one or more movable objects, or a combination thereof) or based at least in part upon routing connectivity. In various embodiments, routing connectivity comprises information or data that may be used to identify to which net a physical design object belongs or to identify how a physical design object is connected to other object(s) in a physical design. These various actions may further comprise the action 108 of performing routing on at least a portion of the physical design to improve or to resolve color conflicts or one or more other conflicts in some embodiments. In some of these embodiments, the method or system performs routing on the at least a portion of the physical design by using, for example but not limited to, one or more search and repair strategies to identify and resolve one or more conflicts. In some embodiments, the method or system iteratively performs actions 110 and 112 until, for example, routing convergence is achieved or a satisfactory design is obtained. In some embodiments, the method or system iteratively performs actions 110, 112, and 108 until, for example, routing convergence is achieved or a satisfactory design is obtained.

FIG. 2A illustrates a high level flow diagram for a method or a system for implementing a physical electronic circuit design with multiple-patterning techniques in some embodiments. In one or more embodiments, the method for implementing a physical electronic circuit design with multiple-patterning techniques may comprise the process 202A of identifying one or more multiple-patterning constraints for multiple-patterning process for manufacturing the electronic circuit. In some embodiments, the method for implementing a physical electronic circuit design with multiple-patterning techniques may comprise the process 204A of coloring a plurality of routing tracks in a first layer of a physical electronic design with a number of colors.

A routing track may be associated with a track spacing or a track pitch and is generally used for global or detail routing guidance in some embodiment. A routing layer may include a fixed number of routing tracks, and the number of available routing track may be used to indicate the capacity of an edge or an area in an electronic circuit design in some embodiments. It shall be noted that the first coloring scheme of the routing tracks in a first layer may be independent of the second coloring scheme of the routing tracks in a second layer in some embodiments. In some other embodiments, the first coloring scheme of the first layer may not be entirely independent from the second coloring scheme of the second layer due to the presence of or need for drop vias to interconnect the first layer and the second layer or due to the need or desire to minimize color conflict.

For example, the second coloring scheme of the second layer may be adjusted to shorten a segment of interconnect to resolve or decrease color conflict. Further details about resolving or decreasing color conflict by using drop vias to interconnect two layers will be provided in the description for FIG. 7F. The routing tracks may be modeled on a corresponding edge of a cell (e.g., a global cell that represents a unit in a congestion map) in some embodiments or may be graphically overlaid in the physical electronic design in some other embodiments. As a result, different schemes of coloring the plurality of routing tracks may be adopted accordingly. Moreover, it shall be noted that the term "color" generally refer to an identification, indication, or association of a design entity (e.g., a shape, a routing track, an interconnect, etc.) in an electronic circuit design with a particular mask design of the electronic circuit design in some embodiments.

An example of such an identification, indication, or association may comprise representing a design in a certain color in a display interface, a flag, link, pointer, or bitmap value to indicate whether a design entity is to be placed in a certain mask design of a plurality of mask designs for the multiple-patterning lithography process. In other words, coloring a routing track with a certain color does not necessarily mean to actually, graphically paint the routing track with the certain color. Therefore, coloring a routing track or an object with a certain color may comprise actually, graphically painting the routing track, the object, or a portion thereof with the certain color in some embodiments or associating or identifying the routing track or the object with the certain mask by using various means such as flag, link, pointer, or bitmap value, etc. in some other embodiments. Throughout the entire disclosure, the term "coloring" may be used to generally and collectively refer to associating or identifying a mask identification for an object or a routing tack, unless otherwise specifically defined or explained.

In some embodiments, the method for implementing a physical electronic circuit design with multiple-patterning techniques may comprise the process 206A of coloring one or more fixed objects in the physical electronic circuit design based at least in part upon the coloring of the plurality of routing tracks. A fixed object may comprise a electronic circuit design component whose location in the electronic circuit design is fixed in various embodiments. Fixed objects may comprise, for example but not limited to, one or more pins, terminals, blockage (e.g., placement blockage, routing blockage, cell blockage, metal blockage, etc.), obstructions, obstacles, fixed interconnects, or a combinations thereof in some embodiments. The method or the system may color a fixed object with the color of the routing track in which the fixed object resides if the fixed object does not occupy a space that is covered by more than one routing track in some embodiments.

In some embodiments where a fixed object occupies a spaces that spans across more than one routing track, the method or the system may color the fixed object by minimizing color conflict. For example, if a fixed object occupies the space that is covered by a first routing track and a second routing track, and if the first length of the portion of the fixed object within the first routing track is shorter than the second length of the remaining portion of the fixed object within the second routing track, the method or the system may color the fixed object with the color of the second routing track because the length of the portion of the fixed object in color conflict is shorter. A segment of an electronic circuit design component is identified to be in color conflict if the color of the segment is different from the color of the underlying routing track that covers the space occupied by the segment in some embodiment. In some embodiments, the method for implementing a physical electronic circuit design with multiple-patterning techniques may comprise the process 208A of performing routing (e.g., global routing, detail routing, or any processes touching upon the routing aspects of the physical electronic circuit design) to improve or to resolve one or more color conflicts or one or more other conflicts or violations.

Figure 2B:
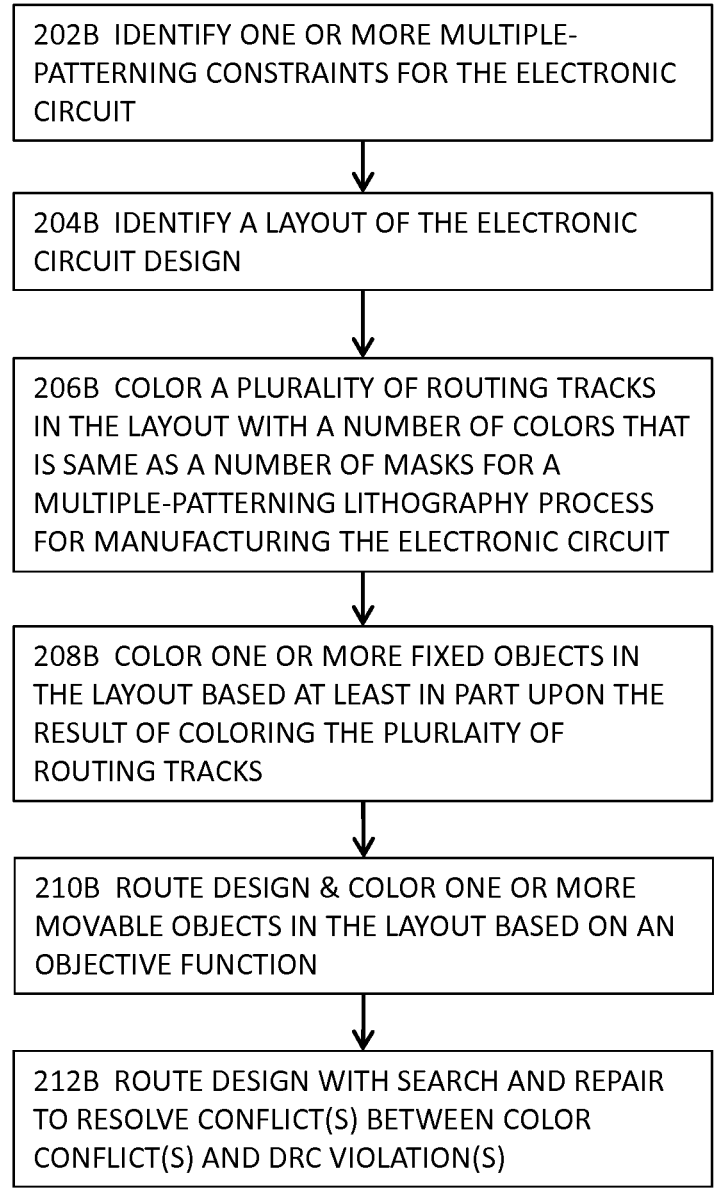
FIG. 2B illustrates a more detailed flow diagram for a method or a system for implementing a physical electronic circuit design with multiple-patterning technique awareness in some embodiments.

FIG. 2B illustrates a more detailed flow diagram for a method or a system for implementing a physical electronic circuit design with multiple-patterning techniques in some embodiments. In some embodiments, the method for implementing a physical electronic circuit design with multiple-patterning techniques may comprise the process 202B of identifying one or more multiple-patterning constraints for an electronic circuit design. In some embodiments, the one or more multiple-patterning constraints may comprise, for example but not limited to, a constraint on minimum spacing between two or more adjacent electronic circuit design components that are placed on the same mask design to address the minimum printable limit of a photolithography process, a constraint on minimum spacing between two or more adjacent electronic circuit design components that are placed on two different mask designs to address, for example, a crosstalk requirement, or a constraint on whether a single object may be split into multiple pieces which may be subsequently stitched together, etc.

In some embodiments, an electronic circuit design component may comprise a single geometric shape such as a rectangular metal shape, a block of electronic circuit design including multiple geometric shapes, a net including the one or more geometric shapes and one or more interconnects in the net, an instance of a cell including one or more geometric shapes and one or more interconnects, etc. In some embodiments, the method for implementing a physical electronic circuit design with multiple-patterning techniques may comprise the process 204B of identifying a physical design of the electronic circuit design. In some embodiments, the physical design may be a partial, incomplete physical design that comprises the electronic circuit component designs of a single net or only a part of a single net. In some embodiments, the physical electronic circuit design identified at 204B comprises one or more geometric shapes that have been placed in the physical electronic circuit design but have not been routed for connectivity.

For example, the physical electronic circuit design may comprise a single shape that has not gone through the global router or the detail router to connect the single shape to one or more other shapes to establish connectivity in some embodiments. In some embodiments, the method for implementing a physical electronic circuit design with multiple-patterning techniques may comprise the process 206B of identifying and coloring a plurality of routing tracks with a number of colors, wherein the number of colors is the same as the total number of mask designs for the multiple-patterning lithography process used for manufacturing the electronic circuit design. For example, the method or the system may color the plurality of routing tracks in two colors for a double-pattern lithography process that uses two masks to manufacturing the electronic circuit.

It shall be noted that the term "color" generally refer to an identification, indication, or association of a design entity (e.g., a shape, a routing track, an interconnect, etc.) in an electronic circuit design with a particular mask design of the electronic circuit design in some embodiments. An example of such an identification, indication, or association may comprise representing a design in a certain color in a display interface, a flag, link, pointer, or bitmap value to indicate whether a design entity is to be placed in a certain mask design of a plurality of mask designs for the multiple-patterning lithography process. In other words, coloring a routing track with a certain color does not necessarily mean to actually, graphically paint the routing track with the certain color. In some embodiments, coloring a routing track with a certain color may simply refer to associating or identifying the routing track with the certain mask by using various means such as flag, link, pointer, or bitmap value, etc.

In some embodiments, the method for implementing a physical electronic circuit design with multiple-patterning techniques may comprise the process 208B of coloring one or more fixed objects in the physical electronic circuit design based at least in part upon the result of coloring the plurality of routing tracks. In some embodiments, the method or the system colors one or more fixed objects to minimize color conflict which indicates that the color of a fixed object is different from the color of an underlying routing track of the fixed object. In some embodiments, the method or the system colors In some embodiments, the method or the system may also color one or more fixed objects both to minimize color conflict and to reduce design rule violations. In some embodiments, the method for implementing a physical electronic circuit design with multiple-patterning techniques may comprise the process 210B of performing routing (e.g., global routing, detail routing, or any processes touching upon the routing aspects of the physical electronic circuit design) on at least a portion of the electronic circuit design and coloring one or more movable objects in the physical electronic design based at least in part upon an objective function or a cost function (collectively objective function.)

A movable object may comprise, for example but not limited to, an interconnect in some embodiments. For example, the method or the system may determine or identify the severity of a color conflict between a movable object and the underlying routing track(s) and associate a penalty with the color conflict based at least in part upon the severity. In these embodiments, the method or the system may further determine an objective function or a cost function which accommodates the penalties associated with coloring one or more movable objects. In some of these embodiments, the method or system may permit some color conflicts between one or more objects on a layer of an electronic design and their respective one or more routing tracks, at least a part of which are occupied by the one or more objects in situations where the physical design of the layer remains decomposable in accordance with the multiple-patterning constraints or where the accumulated penalty remains below a certain permissible level.

In some embodiments, the method for implementing a physical electronic circuit design with multiple-patterning techniques may comprise the process 212B of performing routing on at least a portion of the physical electronic circuit design to resolve or to improve one or more conflicts. In some of these embodiments, the method or system performs routing on the at least a portion of the physical electronic circuit design by using, for example, one or more search and repair strategies to identify and to resolve or improve one or more conflicts (e.g., one or more color conflicts, one or more mask conflicts, or one or more constraint violations.) In some embodiments, the method or system may further comprise the process 210B of resolving or improving one or more design rule violations. In some embodiments, the one or more design rule violations may arise out of the coloring of one or more fixed objects or the coloring of one or more movable objects. In some embodiments, the fixed objects and the movable objects are "colored" appropriately in accordance with the one or more applicable multiple-patterning constraints as these fixed objects and movable objects are being created in the electronic circuit design. In these embodiments, the electronic circuit design after the performance of various processes described herein is multiple-patterning clean. That is, the electronic circuit design satisfies the one or more applicable multiple-patterning constraints as the electronic circuit design is being created and thus renders the conventional mask splitting processes trivial because the electronic circuit design satisfies the one or more applicable multiple-patterning constraints upon its creation.

Figure 3:
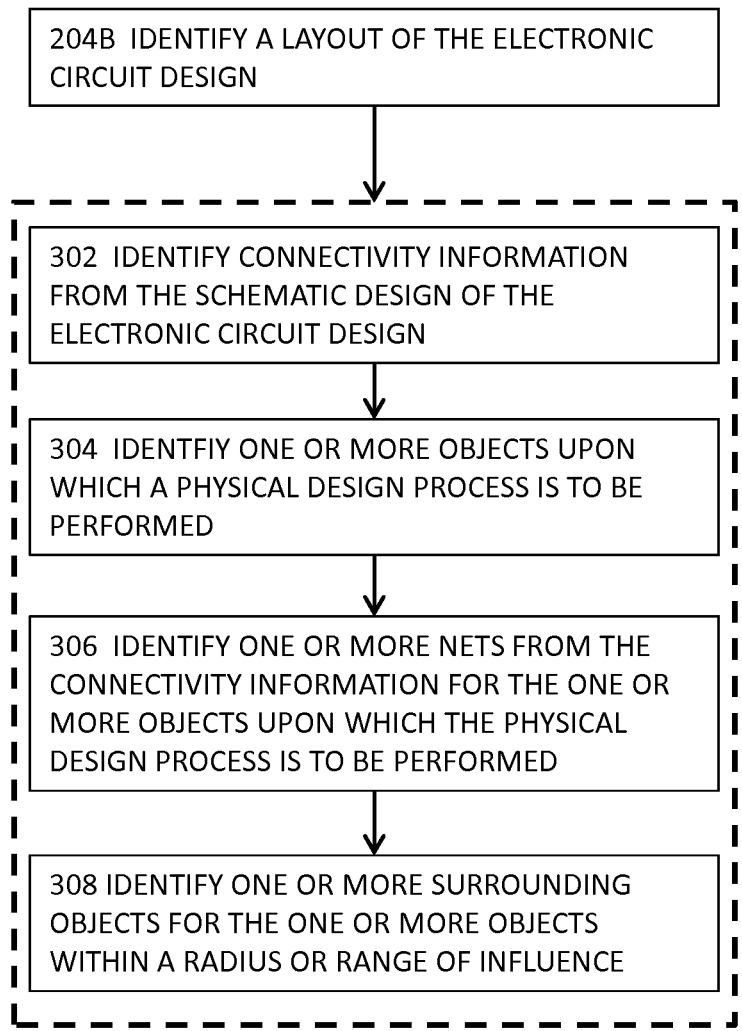
FIG. 3 illustrates more details about a sub-process or sub-module 204B illustrated in FIG. 2B in some embodiments.

FIG. 3 illustrates more details about a sub-process or sub-module 204B illustrated in FIG. 2B in some embodiments. In some embodiments, the process or module 204B of identifying a layout of an electronic circuit design may comprise the sub-process or sub-module 302 of identifying connectivity information or data from the schematic design of the electronic circuit design. In some embodiments, the method or the system may use the connectivity information or data to determine to which net (nets) some geometric shapes belong. The sub-process or sub-module 302 may also identify one or more netlists or one or more nets in some embodiments. In some embodiments, the process or module 204B of identifying a layout of an electronic circuit design may comprise the sub-process or sub-module 304 of identifying one or more objects upon which global routing or placement is to be performed.

In some embodiments, the process or module 204B of identifying a layout of an electronic circuit design may comprise the sub-process or sub-module 306 of identifying one or more nets from the connectivity information for the one or more objects to be floor-planned, placed, or routed (e.g., global routing or detail routing). In some embodiments, the process or module 204B of identifying a layout of an electronic circuit design may comprise the sub-process or sub-module 308 of identifying one or more surrounding objects for the one or more objects within a radius or range of influence. In some embodiments, the sub-process or sub-module 308 identifies one or more surrounding objects for the one or more objects within a radius or range of influence to determine whether one or more constraints are satisfied.

In some embodiments, the method or the system uses the range or radius of influence to limit the scope of analysis. In these embodiments, the method or the system utilizes the range or radius of influence to determine how far or how big of an area in the electronic circuit design the method or the system needs to examine to determine the cascading effects of coloring a certain object with a certain color. In one example, the method or the system may utilize a default range or radius of influence that may include, for example, the current display window in the physical design session for the electronic circuit design. In some embodiments, the method or the system may utilize connectivity information for a current object of interest, the net thereof, or electrical or parasitic effects to determine the range or radius of influence.

For example, the method or the system may utilize the connectivity information to identify what other objects are connected directly or indirectly to the current object or what other nets are connected to or interacting with the net to which the current object belongs in order to determine the range or radius of influence. Once the range or radius of influence is determined, the method or the system may further examine the objects and the associated routing tracks within the range or radius of influence to determining the cascading effects of coloring a certain object with a certain color or coloring a routing track with a certain color. The method may further utilize the range or radius of influence to determine or identify one or more changes within the range or radius of influence that arise out of coloring a certain object or routing track with a certain color. For example, coloring a first object with a first color may require another object, which has already been colored with a second color, to be re-colored with the first color, if the first object is connected to the second object, and if a constraint requiring connected objects to be printed with the same mask is determined to control.

Figure 4A:
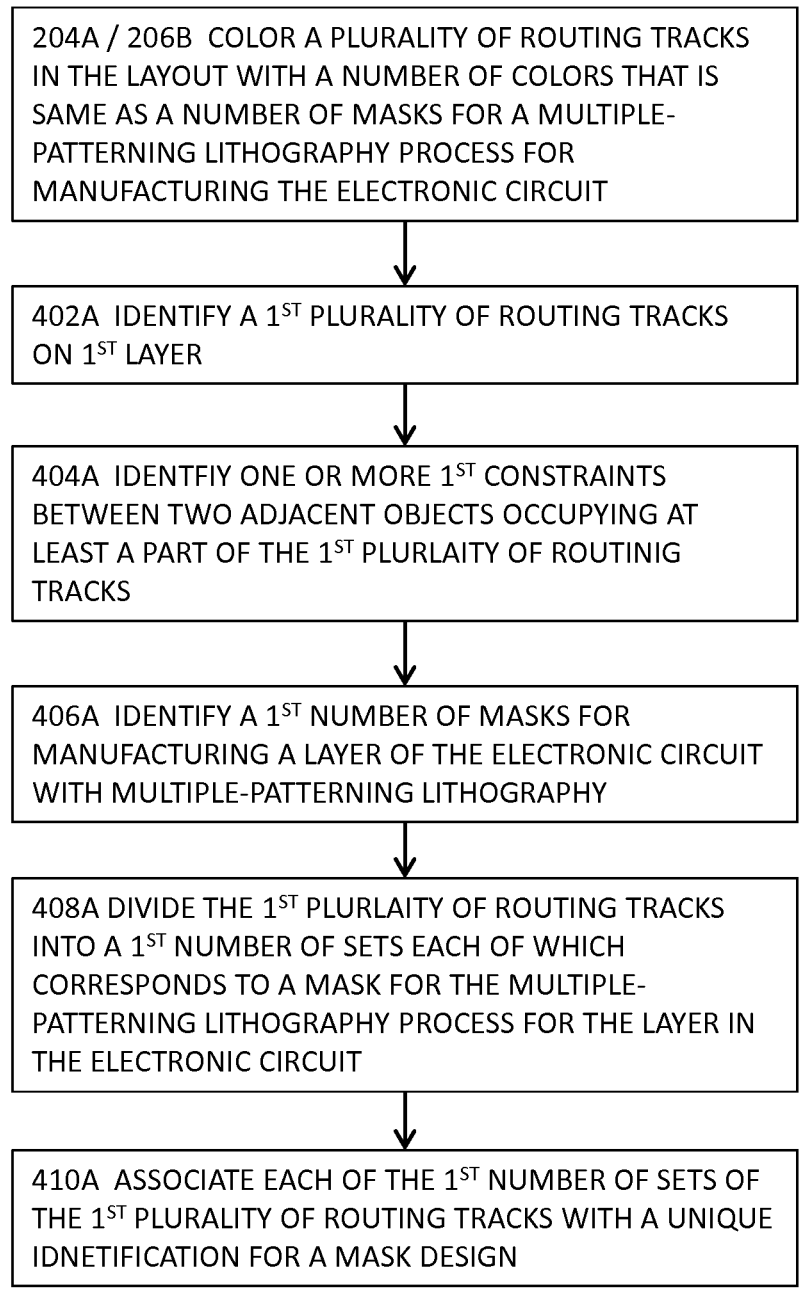
FIG. 4A illustrates more details about a sub-process or sub-module 204A illustrated in FIG. 2A or the sub-process or sub-module 206B illustrated in FIG. 2B in some embodiments.

FIG. 4A illustrates more details about a sub-process or sub-module 204A illustrated in FIG. 2A or the sub-process or sub-module 206B illustrated in FIG. 2B in some embodiments. In some embodiments, the process or module 204A or 206B of coloring a plurality of routing tracks may comprise the sub-process or sub-module 402A of identifying a first plurality of routing tracks on first layer. In some embodiments, the process or module 204A or 206B of coloring a plurality of routing tracks may comprise the sub-process or sub-module 404A of identifying one or more first constraints between two or more adjacent objects occupying at least a part of the first plurality of routing tracks. In some embodiments, the one or more first constraints may comprise, for example but not limited to, a multiple-patterning constraint for the electronic design subject to multiple-patterning lithography processes.

A typical example of a multiple-patterning constraint comprises a multiple-patterning minimum spacing constraint for two or more adjacent objects on the same mask. Another example of a multiple-pattern constraint comprises a minimum spacing constraint on the minimum spacing between two or more adjacent objects that are placed in two different mask designs. The one or more constraints may also comprise a same mask constraint which requires certain objects (e.g., objects that are connected each other) to be printed with the same mask. In some embodiments, the process or module 204A or 206B of coloring a plurality of routing tracks may comprise the sub-process or sub-module 406A of identifying a first number of masks for manufacturing a layer of the electronic circuit with multiple-patterning lithography processes. It shall be noted that although some examples below describe some designs with double-patterning techniques, various embodiments described herein shall not be limited as such and apply equally to electronic circuit designs with other multiple-patterning techniques.

In some embodiments, the process or module 204A or 206B of coloring a plurality of routing tracks may comprise the sub-process or sub-module 408A of dividing the first plurality of routing tracks into a first number of sets of routing tracks, where each of the first number of sets corresponds to a mask for the multiple-patterning lithography process. For example, if a layer of an electronic circuit design is to be manufactured with the triple-patterning lithography process, the design of the layer will be split into three masks, and the method or the system also divides a plurality of routing tracks for the layer into three sets at 408A. In some embodiments, the process or module 204A or 206B of coloring a plurality of routing tracks may comprise the sub-process or sub-module 410A of associating each of the first number of sets of the first plurality of routing tracks with a unique identification. In some embodiments, the method or the system color each of the first number of sets with a unique color. In some embodiments, the unique indication includes a unique color, a visual indication, a graphical indication or representation, or a textual indication or representation.

Figure 4B:
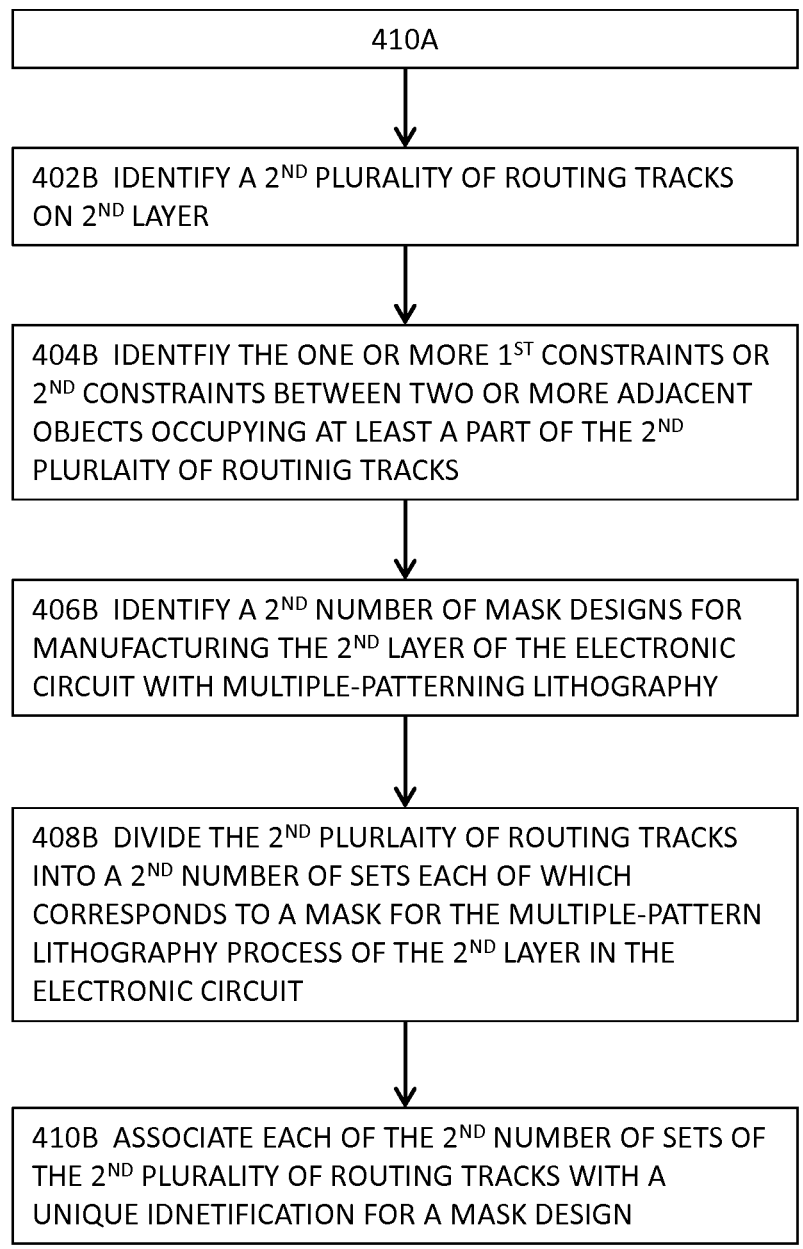
FIG. 4B illustrates more details about a sub-process or sub-module 410A illustrated in FIG. 4A in some embodiments.

FIG. 4B illustrates more details about a sub-process or sub-module 410A illustrated in FIG. 4A in some embodiments. In some embodiments, FIG. 4B illustrates that a first layer of the electronic circuit design may be colored independently from the second layer. In some embodiments, the process or module 410A of associating each of the first number of sets of the first plurality of routing tracks may comprise the sub-process or sub-module 402B of identifying a second plurality of routing tracks on a second routing layer. In some embodiments where the first layer and the second layer are adjacent to each other, the first plurality of routing tracks are orthogonal to the second plurality of routing tracks. The first plurality of routing tracks or the second plurality of routing track may be aligned with a Manhattan grid or a diagonal grid of an arbitrary angle.

In some embodiments, the process or module 410A of associating each of the first number of sets of the first plurality of routing tracks may comprise the sub-process or sub-module 404B of identifying the one or more first constraints identified at 404A or one or more second constraints between two or more adjacent objects that occupy at least a part of the second plurality of routing tracks. In some embodiments, the first layer and the second layer may be subject to the same constraints, and thus the one or more first constraints identified at 404A may also apply to the second layer with the second plurality of routing tracks. In some other embodiments, the first layer and the second layer may not be subject to the same constraints, and thus the one or more first constraints identified at 404A may not necessarily apply to the second layer with the second plurality of routing tracks.

In these latter embodiments, the method or the system identifies one or more second constraints for two or more adjacent objects that occupy at least a part of the second plurality of routing tracks. In some embodiments, the second layer may require one or more second constraints in addition to the one or more first constraints identified at 404A for the first layer. In these embodiments, the process or module 410A identifies both the one or more first constraints and one or more second constraints for the second layer with the second plurality of routing tracks. In some embodiments, the one or more first constraints comprise, for example but not limited to, one or more constraints on geometries of object(s), size(s) of object(s), spacing value(s) between two adjacent objects, constraint(s) on the mask identification(s), or a combination thereof. A constraint on the mask identification may impose limitations on mask assignments for various objects on a layer of an electronic design to ensure that the layer may be decomposable for the applicable multiple-patterning techniques.

In some embodiments, the process or module 410A of associating each of the first number of sets of the first plurality of routing tracks may comprise the sub-process or sub-module 406B of identifying a second number of masks for manufacturing the second layer of the electronic circuit with multiple-patterning lithography processes. It shall be noted that not all layers of an electronic circuit design need to be manufactured with multiple-patterning lithography processes, and that two layers of the same electronic circuit design may be manufactured with different multiple-patterning lithography processes. In some embodiments, the process or module 410A of associating each of the first number of sets of the first plurality of routing tracks may comprise the sub-process or sub-module 408B of dividing the second plurality of routing tracks into a second number of sets of a second plurality of routing tracks, each corresponding to a mask for the multiple-patterning lithography process of the second layer in the electronic circuit design.

In some embodiments, the process or module 410A of associating each of the first number of sets of the first plurality of routing tracks may comprise the sub-process or sub-module 410B of associating each of the second number of sets of the second plurality of routing tracks with a unique identification. It shall be noted that the term "color" generally refer to an identification, indication, or association of a design entity (e.g., an object, a routing track, an interconnect, etc.) in an electronic circuit design with a particular mask design of the electronic circuit design in some embodiments. An example of such an identification, indication, or association may comprise representing a design in a certain color in a display interface, a flag, link, pointer, or bitmap value to indicate whether a design entity is to be placed in a certain mask design of a plurality of mask designs for the multiple-patterning lithography process. In other words, coloring a routing track with a certain color does not necessarily mean to actually, graphically paint the routing track with the certain color. In some embodiments, coloring a routing track with a certain color may simply refer to associating or identifying the routing track with the certain mask by using various means such as flag, link, pointer, or bitmap value, etc.

Figure 4C:
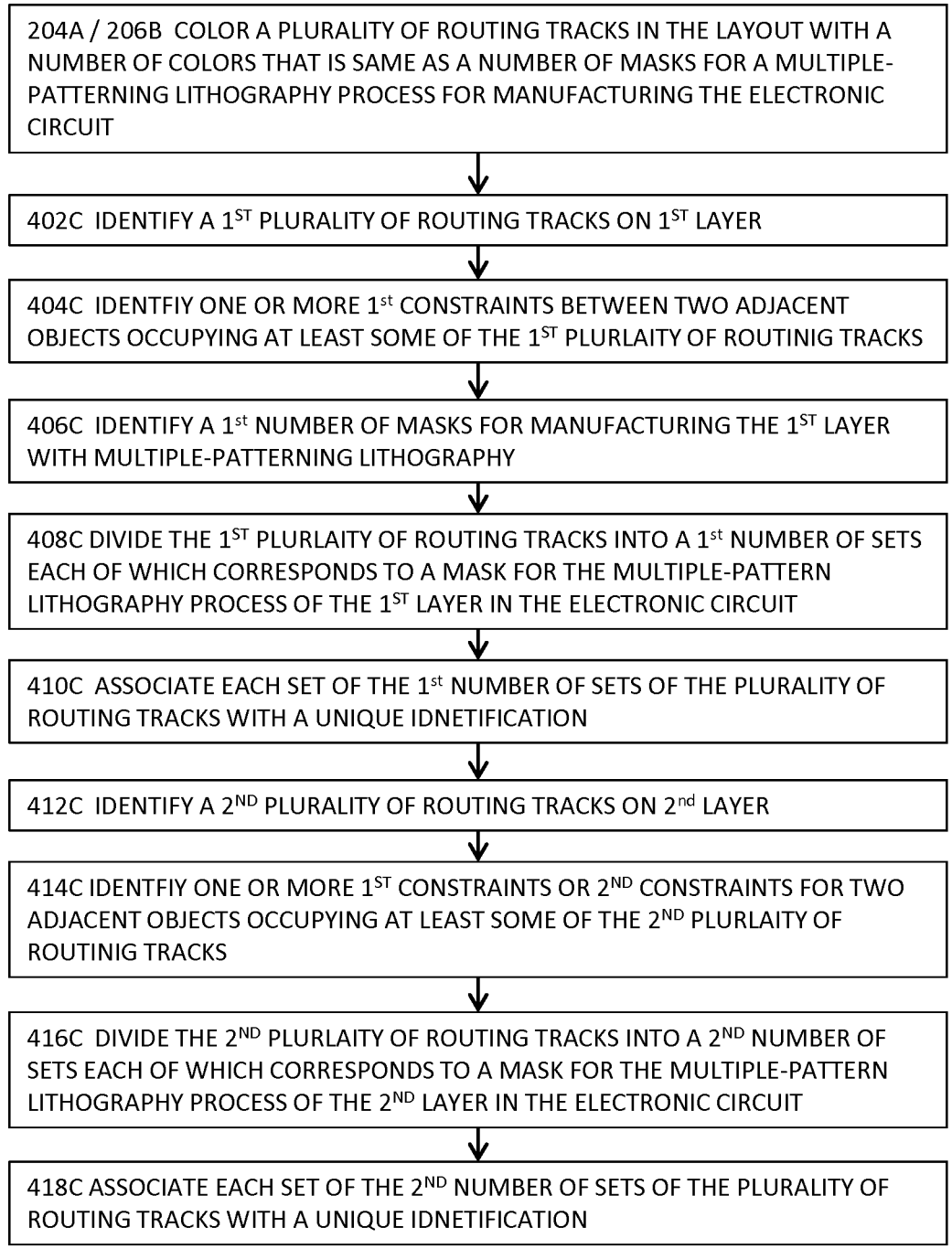
FIG. 4C illustrates more details about a sub-process or sub-module 204A illustrated in FIG. 2A or the sub-process or sub-module 206B illustrated in FIG. 2B in some embodiments.

FIG. 4C illustrates more details about a sub-process or sub-module 204A illustrated in FIG. 2A or the sub-process or sub-module 206B illustrated in FIG. 2B in some embodiments. In some embodiments, the process or module 204A or 206B of coloring a plurality of routing tracks may comprise the sub-process or sub-module 402C of identifying a first plurality of routing tracks on a first layer of an electronic circuit design. In some embodiments, the process or module 204A or 206B of coloring a plurality of routing tracks may comprise the sub-process or sub-module 404C of identifying one or more first constraints between two adjacent or more objects that occupy at least some of the first plurality of routing tracks. In some embodiments, the one or more first constraints comprise one or more spacing rules.

In some embodiments, a constraint such as a spacing constraint may comprise a single value controlling, for example, the minimum spacing value between two sides or two corners of the two or more adjacent objects in order to be printed with a single mask or two masks. In some embodiments, a constraint such as a spacing constraint that corresponds to a list of values or a data structure (e.g., a table, a database, etc.) that specifies a plurality of permitted spacing values relative to, for example, parallel run-lengths between the two or more adjacent objects. In some embodiments, the process or module 204A or 206B of coloring a plurality of routing tracks may comprise the sub-process or sub-module 406C of identifying a first number of masks for manufacturing the first layer of the electronic circuit with multiple-patterning lithography processes.

It shall be noted that not all layers of an electronic circuit design are to be manufactured with multiple-patterning lithography processes, and that not all layers of an electronic circuit that are subject to multiple-patterning lithography processes are to be manufactured with the same multiple-patterning lithography processes requiring the same number of masks. In some embodiments, the process or module 204A or 206B of coloring a plurality of routing tracks may comprise the sub-process or sub-module 408C of dividing the first plurality of routing tracks into a first number of sets, where the first number is equal to the number of masks required to manufacturing the layer with multiple-patterning lithography processes. In some embodiments, the process or module 204A or 206B of coloring a plurality of routing tracks may comprise the sub-process or sub-module 410C of associating each set of the first number of sets of routing tracks with a unique identification.

It shall be noted that the term "color" generally refer to an identification, indication, or association of a design entity (e.g., an object, a routing track, an interconnect, etc.) in an electronic circuit design with a particular mask design of the electronic circuit design in some embodiments. An example of such an identification, indication, or association may comprise representing a design in a certain color in a display interface, a flag, link, pointer, or bitmap value to indicate whether a design entity is to be placed in a certain mask design of a plurality of mask designs for the multiple-patterning lithography process. In other words, coloring a routing track with a certain color does not necessarily mean to actually, graphically paint the routing track with the certain color. In some embodiments, coloring a routing track with a certain color may simply refer to associating or identifying the routing track with the certain mask by using various means such as flag, link, pointer, or bitmap value, etc.

In some embodiments, the process or module 204A or 206B of coloring a plurality of routing tracks may comprise the sub-process or sub-module 412C of identifying a second plurality of routing tracks on a second layer of the electronic circuit design. In some embodiments, the second plurality of routing tracks are oriented in a second direction that is orthogonal to the first direction of the first plurality of routing tracks of the first layer. In some embodiments, the first plurality of routing tracks or the second plurality of routing tracks are aligned with a Manhattan grid. In some other embodiments, the first plurality of routing tracks or the second plurality of routing tracks are aligned with an arbitrary direction such as the 45-degree or 135-degree diagonal routing grid or other orientations. In some embodiments, the process or module 204A or 206B of coloring a plurality of routing tracks may comprise the sub-process or sub-module 414C of identifying one or more first constraints identified at 404C or one or more second constraints controlling the relative positioning of two or more adjacent objects that occupy at least some of the second plurality of routing tracks.

The one or more first constraints or the one or more second constraints may comprise, for example but not limited to, a spacing constraint, a corner-to-corner constraint, a net-to-net constraint, or a voltage-based constraint, etc. Each constraint may has a single value or may correspond to a data structure that lists a plurality of permissible values with respect to other characteristics (e.g., parallel run-lengths between the two adjacent objects) as described above. In some embodiments, the process or module 204A or 206B of coloring a plurality of routing tracks may comprise the sub-process or sub-module 416C of dividing the second plurality of routing tracks into a second number of sets, where the second number is equal to the total number of masks that will be used to manufacture the second layer of the electronic circuit according to some multiple-patterning lithography processes. In some embodiments, the process or module 204A or 206B of coloring a plurality of routing tracks may comprise the sub-process or sub-module 418C of associating each set of the second number of sets with a unique identification that indicate which mask a particular set of routing tracks are associated with.

Figure 4D:
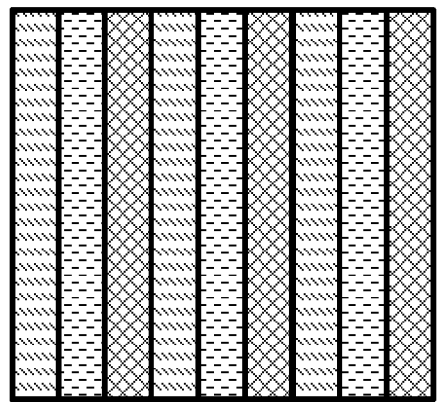
FIGS. 4D-F illustrate some exemplary coloring schemes for a plurality of routing tracks in some embodiments.
Figure 4E:
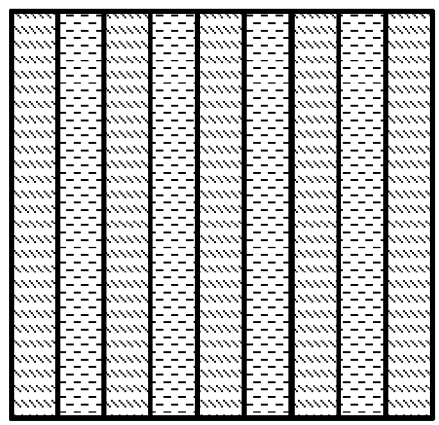
Figure 4F:
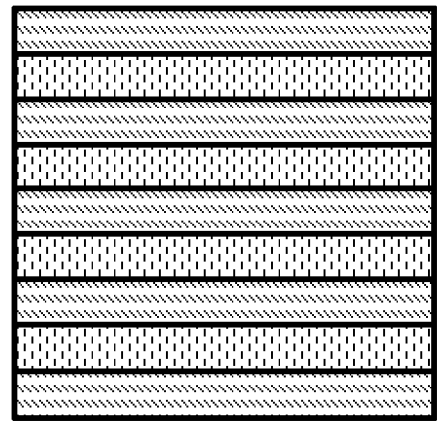

FIGS. 4D-F illustrate some exemplary coloring schemes for a plurality of routing tracks in some embodiments. FIG. 4D illustrates some embodiments where an exemplary layer in an electronic circuit design is overlaid with a plurality of vertical routing tracks. The plurality of routing tracks in this example illustrated in FIG. 4D are divided into three sets, each of which is identified with a unique hatch pattern to indicate which mask design a particular set is associated with. The three sets correspond to the three masks that may be used to manufacture this particular layer of the electronic circuit with triple-patterning lithography processes. FIG. 4E illustrates some embodiments where an exemplary layer in an electronic circuit design is overlaid with a plurality of vertical routing tracks.

The plurality of routing tracks in this example illustrated in FIG. 4E are divided into two sets, each of which is identified with a unique hatch pattern to indicate which mask design a particular set is associated with. The two sets correspond to the two masks that may be used to manufacture this particular layer of the electronic circuit with double-patterning lithography processes. FIG. 4F illustrates some embodiments where an exemplary layer in an electronic circuit design is overlaid with a plurality of horizontal routing tracks. The plurality of routing tracks in this example illustrated in FIG. 4F are divided into two sets, each of which is identified with a unique hatch pattern to indicate which mask design a particular set is associated with. The two sets correspond to the two masks that may be used to manufacture this particular layer of the electronic circuit with double-patterning lithography processes.

It shall be noted that FIGS. 4D-F illustrate that the routing tracks in a particular layer are "colored" with alternating patterns. Nonetheless, this alternating "coloring" may not necessarily be the case in some embodiments where the method or the system may allocate two or even more routing tracks for, for example, routing some interconnects in some part of an electronic circuit design. In these embodiments, the method or the system will identify the appropriate number of consecutive routing tracks with appropriate mask identifications accordingly.

Figure 5:
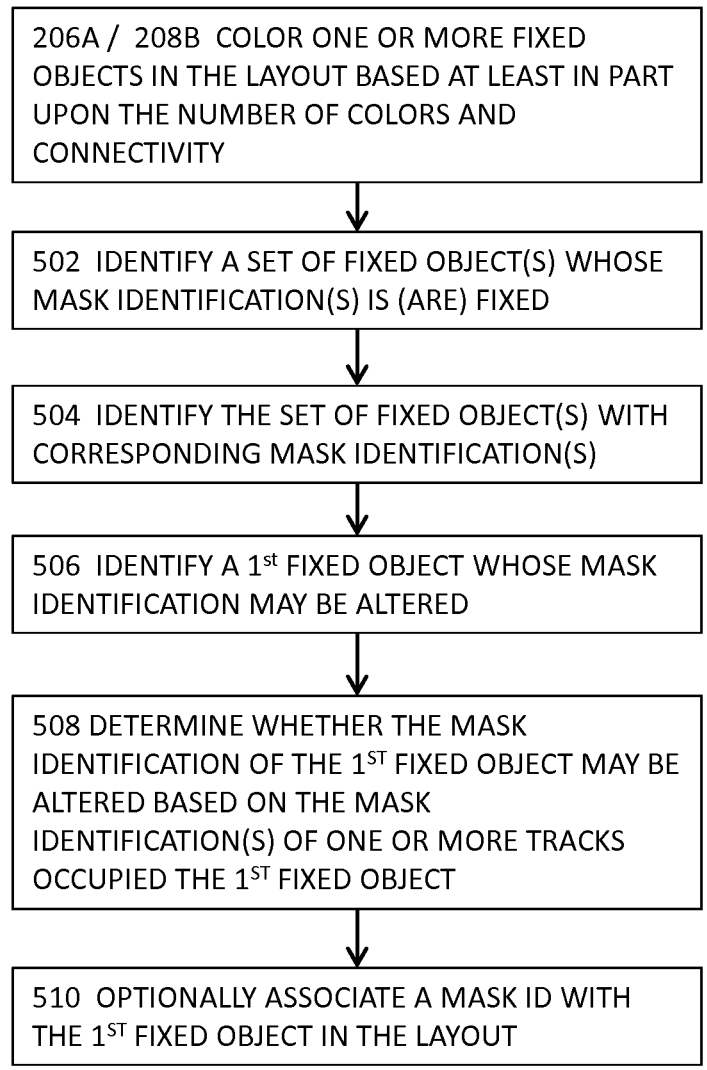
FIG. 5 illustrates more details about the sub-process or sub-module 206A illustrated in FIG. 2A or the sub-process or sub-module 208B illustrated in FIG. 2B in some embodiments.

FIG. 5 illustrates more details about the sub-process or sub-module 206A illustrated in FIG. 2A or the sub-process or sub-module 208B illustrated in FIG. 2B in some embodiments. In these embodiments, the method or system uses the colors or the mask identifications of the plurality of routing tracks as guidance for global or detail routing. In some of these embodiments, the method or system uses the mask identifications of the plurality of routing tracks to reduce conflicts between the mask identifications of physical design objects and the mask identifications of the plurality of routing tracks. Various embodiments reduce the extent of a color conflict between a physical design object and one or more associated routing tracks to a localized, smaller region in a physical design and thus effectively reduce the scope of mask splitting or electronic design decomposition from a global concern to a local task confined within a much smaller area of the physical design. Some embodiments may further completely eliminate such color conflicts by perform various processes as described herein. In some of these embodiments, the reduction of color conflict between a physical design object and a routing track may in turn reduce mask conflict that indicates a conflict between mask identification of two physical design objects. In some of these embodiments, the method or system may further explicitly reduce mask conflicts by, for example, expressly associating greater weight or penalty for a mask conflict.

In some embodiments, the process or module 206A or 208B of coloring a plurality of routing tracks may comprise the sub-process or sub-module 502 of identifying a set of one or more fixed objects whose mask identifications are fixed and cannot be altered. It shall be noted that certain objects, objects, or components may be required to be printed with a certain mask and thus their mask indications may be fixed and may not be altered. In some embodiments, the process or module 206A or 208B of coloring a plurality of routing tracks may comprise the sub-process or sub-module 504 of identifying the set of one or more fixed objects with corresponding mask identifications. For example, the process or module 504 may identify that the mask identifications of a particular set of pins may be associated with a first mask design, and that the mask identification of a routing blockage is associated with a second mask design.

In some embodiments, the process or module 206A or 208B of coloring a plurality of routing tracks may optionally comprise the sub-process or sub-module 506 of identifying or determine where there exists a first fixed object in the set of one or more fixed objects whose mask identification may be altered. It shall be noted that although it may be preferable to print certain fixed objects with a first mask, these certain fixed objects or at least some of them may nonetheless be printed with a second mask. As a result, the mask identifications of these certain fixed objects or at least some of them may thus be altered. The sub-process or sub-module 506 thus identifies whether such fixed objects exist in these embodiments. In some embodiments, the process or module 206A or 208B of coloring a plurality of routing tracks may comprise the sub-process or sub-module 508 of determining whether the original mask identification of the first fixed object identified at 504 may be altered based at least in part on the mask identifications of one or more routing tracks that are at least partially occupied by the first fixed object.

In some embodiments, the sub-process or sub-module 508 determines whether the original mask identification of the first fixed object may be altered based at least in part upon a cost function or an objective function that is to minimize color conflict between one or more sub-parts of the first fixed object and the one or more routing tracks that are at least partially occupied by the first fixed object or to minimize a mask conflict between two physical design components. In some embodiments, a mask conflict, which exists between the colors of two physically connected physical design objects, may be assigned more weight or greater penalty than a color conflict, which exists between the color of a physical design object and that of its underlying routing track. In some embodiments, the term "mask conflict" may be used interchangeably with the term "multiple-patterning constraint conflict" to indicate that there is a conflict in the respective colors of two objects that are connected in a physical design. In some embodiments, the cost function or the objective function is devised in such a way to ensure that the physical design may be decomposable in accordance with the requirements of multiple-patterning techniques. More details about the sub-process or sub-module 508 will be provided in some of the following paragraphs with reference to FIGS. 7A-G.

In some embodiments where splitting an object into multiple sub-components and subsequently stitching the multiple sub-component are not permitted, the process or module 206A or 208B of coloring a plurality of routing tracks may comprise the sub-process or sub-module 510 of associating another mask identification with the first fixed object. In some embodiments where splitting an object into multiple sub-components and subsequently stitching the multiple sub-component are permitted, the process or module 206A or 208B of coloring a plurality of routing tracks may comprise the sub-process or sub-module 510 of associating another mask identification with a part of the first fixed object whose mask identification is altered at 508.

Figure 6:
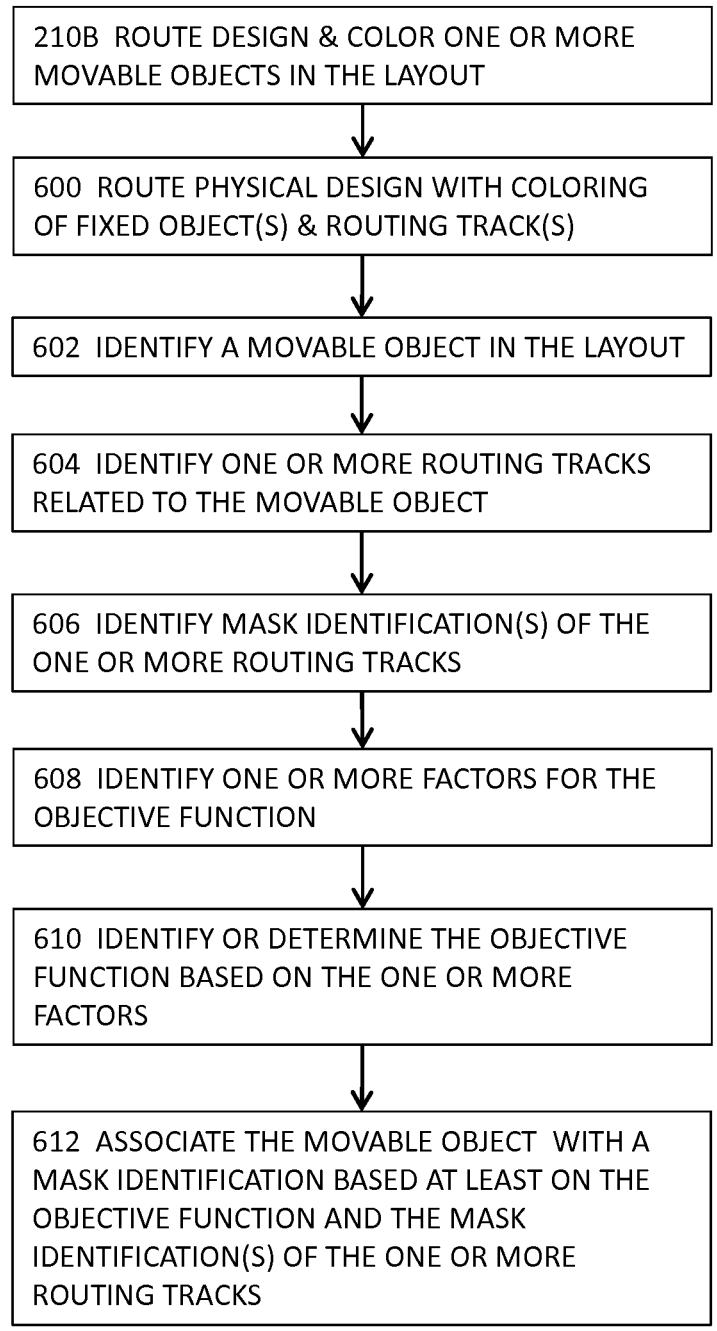
FIG. 6 more details about the sub-process or sub-module the sub-process or sub-module 210B illustrated in FIG. 2B in some embodiments.

FIG. 6 more details about the sub-process or sub-module the sub-process or sub-module 210B illustrated in FIG. 2B in some embodiments. In some embodiments, the process or module 210B of performing routing (e.g., global routing, detail routing, or any processes touching upon the routing aspects of the physical electronic circuit design) on at least a portion of the electronic circuit design and coloring one or more movable objects in the layout may comprise the sub-process or sub-module 600 of performing routing on at least a portion of a layout with the coloring of one or more fixed objects or the coloring of a plurality of routing tracks. In some embodiments, the process or module 210B may further comprise the respective process or module 602 of identifying a movable object in the layout. In some embodiments, a movable object comprises an object whose location may be created or modified in an electronic circuit design. In some embodiments where the processes or modules described herein apply to the context of placement of objects in an electronic circuit design, a movable object comprises an object that may be created, moved, (e.g., by translating, rotating, mirroring, shrinking, or enlarging), or modified (e.g., changing a shape of the object) in the electronic circuit design.

In some embodiments where the processes or modules described herein apply to the context of routing for an electronic circuit design, a movable object may comprise an object that is being created or modified in the electronic circuit design. An example of such a movable object comprises, for example but not limited to, a global route or a detail route. In some embodiments, the process or module 210B of coloring one or more movable objects in the layout may comprise the sub-process or sub-module 604 of identifying one or more routing tracks that are related to the movable object. In some embodiments where the movable object comprises an interconnect between two objects, the sub-process or sub-module 604 may examine the routing tracks between the two objects to identify the one or more routing tracks that may be related to the movable object.

In some embodiments, the process or module 2108 of coloring one or more movable objects in the layout may comprise the sub-process or sub-module 606 of identifying the corresponding one or more mask identifications for the one or more routing tracks that may be related to the movable object. In some embodiments, the process or module 2108 of coloring one or more movable objects in the layout may comprise the sub-process or sub-module 608 of identifying one or more factors for an objective function or a cost function. The one or more factors may comprise, for example, a penalty that is assessed for color conflict between an object (e.g., a fixed object, a movable object, or a portion thereof) and one or more routing tracks that are at least partially occupied by the object in some embodiments.

The one or more factors may comprise a penalty that is assessed for color conflict per unit length between an object and one or more routing tracks that are at least partially occupied by the object in some embodiments. In these latter embodiments, the longer a part of an object exhibits color conflict with some underlying routing tracks, the more severe the penalty will be assessed. In some embodiments, the one or more factors may comprise parallel run-length(s) in color conflict, factor(s) related to one or more electrical or parasitic effects (e.g., electromigration effects, IR-drop, cross-talk, noise, etc.), or factor(s) related to one or more voltage-based constraints, etc. A penalty may comprise, for example, a deduction in guaranteed yield of the electronic circuit. In some embodiments, the process or module 2108 of coloring one or more movable objects in the layout may comprise the sub-process or sub-module 610 of identifying or determining the objective function or cost function based at least in part upon the one or more factors identified or determined at 608.

In some embodiments, the process or module 2108 of coloring one or more movable objects in the layout may comprise the sub-process or sub-module 612 of associating the movable object with a mask identification based at least on the objective function and the one or more mask identifications of the one or more routing tracks that may be related to the movable object. In some embodiments, the sub-process or sub-module 612 may further comprise the sub-process or sub-module of creating or modifying the movable object in the electronic circuit design. For example, a user may create a route between two objects in an electronic circuit design, and the method or the system may determine which mask the route is to be associated with based on the objective function or the cost function in some embodiments where the processes or modules described herein apply to the routing context of an electronic circuit.

Figure 7A:
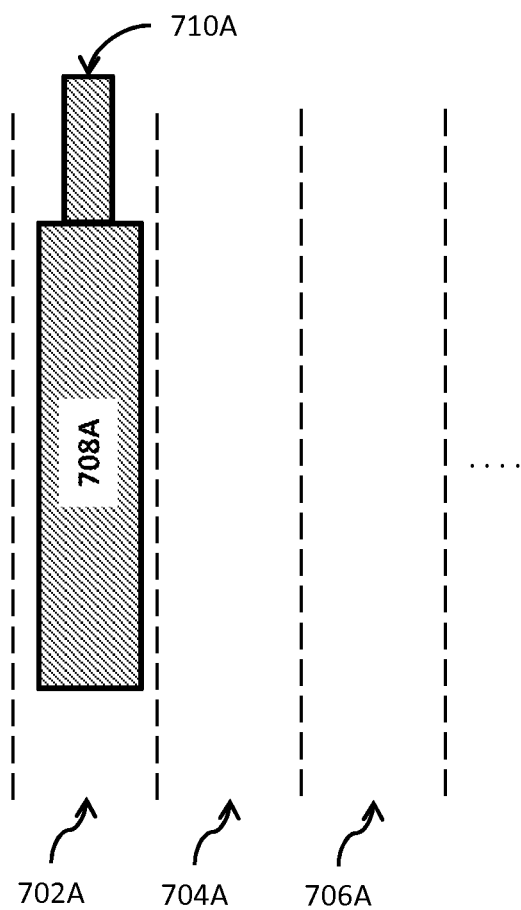
FIGS. 7A-G illustrate some examples of a method or a system for implementing a physical electronic design with multiple-patterning technique awareness in some embodiments.

FIGS. 7A-G illustrate some examples of a method or a system for implementing a physical electronic design with multiple-patterning techniques in some embodiments. FIG. 7A illustrates a part of a layer of an electronic circuit design with three routing tracks—702A, 704A, and 706A. The method or the system may first color the three routing tracks with one or more mask identifications (not shown for clarify purposes.) The layer includes a first object 708A that is physically connected to the second object 710A. For example, the first object 708A may comprise a fixed object, such as a pin. The method or the system first colors the first object with the mask identification of the routing track 702A to avoid color conflict. A user may route an interconnect (the second object 710A) from or to the first object 708A. Assuming the second object 710A stays within the routing track 702A, the method or the system may then color the second object 710A with the same mask identification as that of the first object 710A or the routing track 720A. As a result, FIG. 7A illustrates that both 708A and 710A may be associated with the same mask identification (in this example, a hatch pattern) of the routing track 702A. In this example, there exists no color conflict because the two objects 708A and 710A.

Figure 7B:
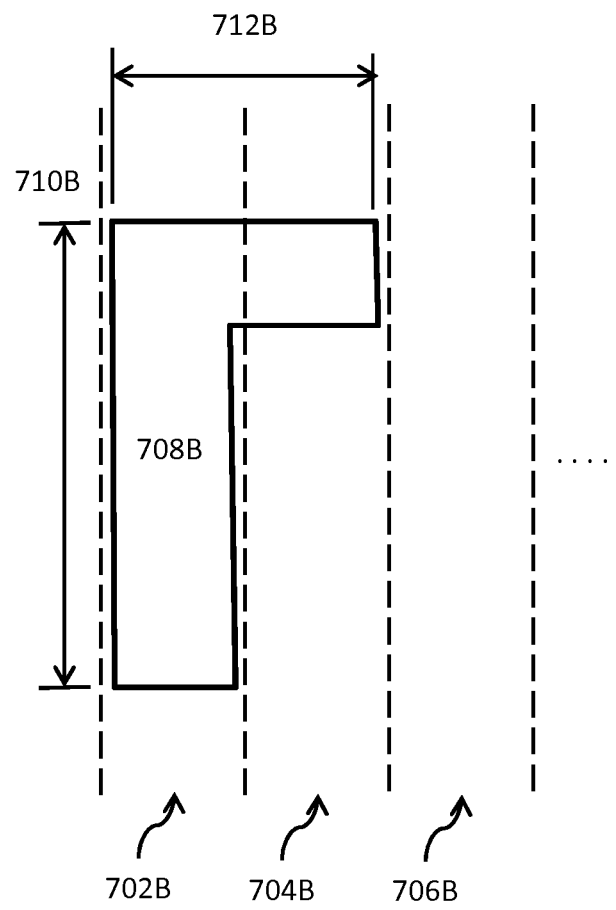
Figure 7C:
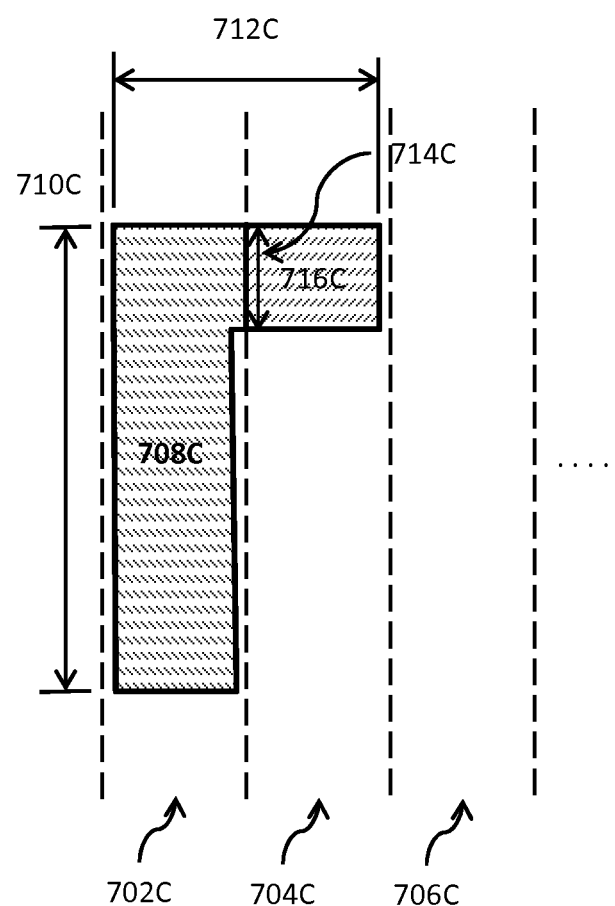

FIG. 7B illustrate a layer of an electronic circuit design with three routing tracks 702B, 704B, and 706B. FIG. 7B further illustrates a polygonal object 708B that occupies a part of the routing track 702B and a part of routing track 704B. In this example illustrated in FIG. 7B, this layer of the electronic circuit is assumed to be manufactured with multiple-patterning lithography, and routing track 702B is associated or colored with a first mask identification (e.g., the first color or the first pattern), and routing track 704B is associated or colored with a second mask identification. FIG. 7B further illustrates that the object 708B has a length 710B that is longer than the overall width 712B. FIG. 7C continues from FIG. 7B and illustrates that the three routing tracks 702C, 704C, and 706C that are identified with multiple mask identifications (not shown for clarity) where 702*c* is associated with a first mask identification and 704C is associated with a second mask identification.

The original object 708C comprises two portions 708C and 716C. In this example illustrated in FIG. 7C, the parallel run-length of the portion 708C is 710C, and the parallel run-length of the portion 716C is 714C. FIG. 7C further illustrates that the object 708C has a length 710C that is longer than the overall width 712C. In some embodiments where splitting a single object into multiple portions and stitching these multiple portions are permitted, the method or the system may identify the first portion 708C with the first mask identification of the routing track 702C and the second portion 716C with the second mask identification of the routing track 704C to avoid color conflict. In some embodiments where splitting and subsequent stitching are not permitted, the method or the system will associate the entire object (both 708C and 716C) with the first mask identification of the routing track 702C because the parallel run-length 710C is longer than the parallel run-length 714C so causing a color conflict with the parallel run-length 714C may be assessed a less severe penalty than causing a color conflict with the parallel run-length 710C by associating the entire object (708C and 716C) with the second mask identification of routing track 704C. In these latter embodiments where splitting and stitching are not permitted, the hatch pattern for the portion 716C indicates a color conflict between the portion 716C and the underlying routing track 704C.

Figure 7D:
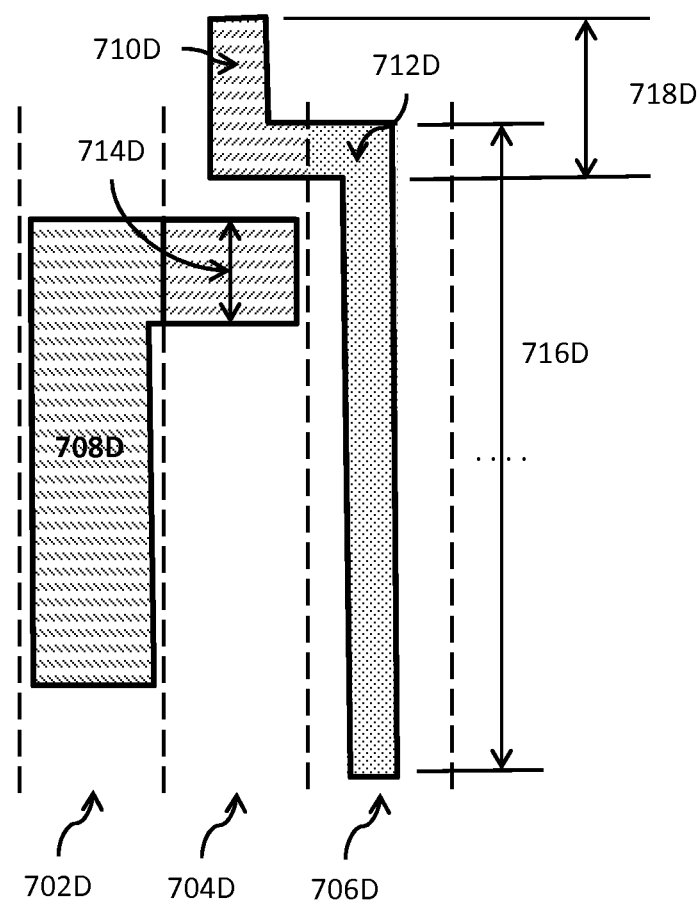

FIG. 7D further continues from FIG. 7C by showing three routing tracks 702D, 704D, and 706D, where 702D and 706D are associated with the same first mask identification (not shown for clarity), and 704D is associated with a second mask identification (not shown for clarity). FIG. 7D further includes a second object 710D that is not designed to be connected with the first object (708D). FIG. 7D illustrates the first option for placing or routing the object 710D by making a turn into routing track 706D to avoid the first object 708D. For the first object 708D, the parallel run-length 714D indicates that there exists a color conflict between the portion indicated by 714D and the underlying routing track 704D. The method or the system may associate the entire second object 710D with the mask identification of routing track 704D in some embodiments where the parallel run-length 716D indicates a color conflict between the portion 712D of the second object with the underlying routing track 706D.

The method or the system may associate the entire second object 710D with the mask identification of routing track 706D in some embodiments where the parallel run-length 718D indicates a color conflict between the portion of the second object 710D and the underlying routing track 704D. In this example illustrated in FIG. 7D, the color conflict indicated by 718D in the latter option is less severe as the color conflict indicated by 716D and thus may be preferable in this specific example. It shall be noted that in the examples illustrated in FIGS. 7A-G, the method or system uses the parallel run-lengths along the routing track direction to assess the severity of color conflicts. Nonetheless, the method or the system may also use other metrics for such severity assessment. For example, the metrics may comprise the area of the portion of an object in color conflict, the linear length (including one or more bends) of an object in color conflict, etc.

Figure 7E:
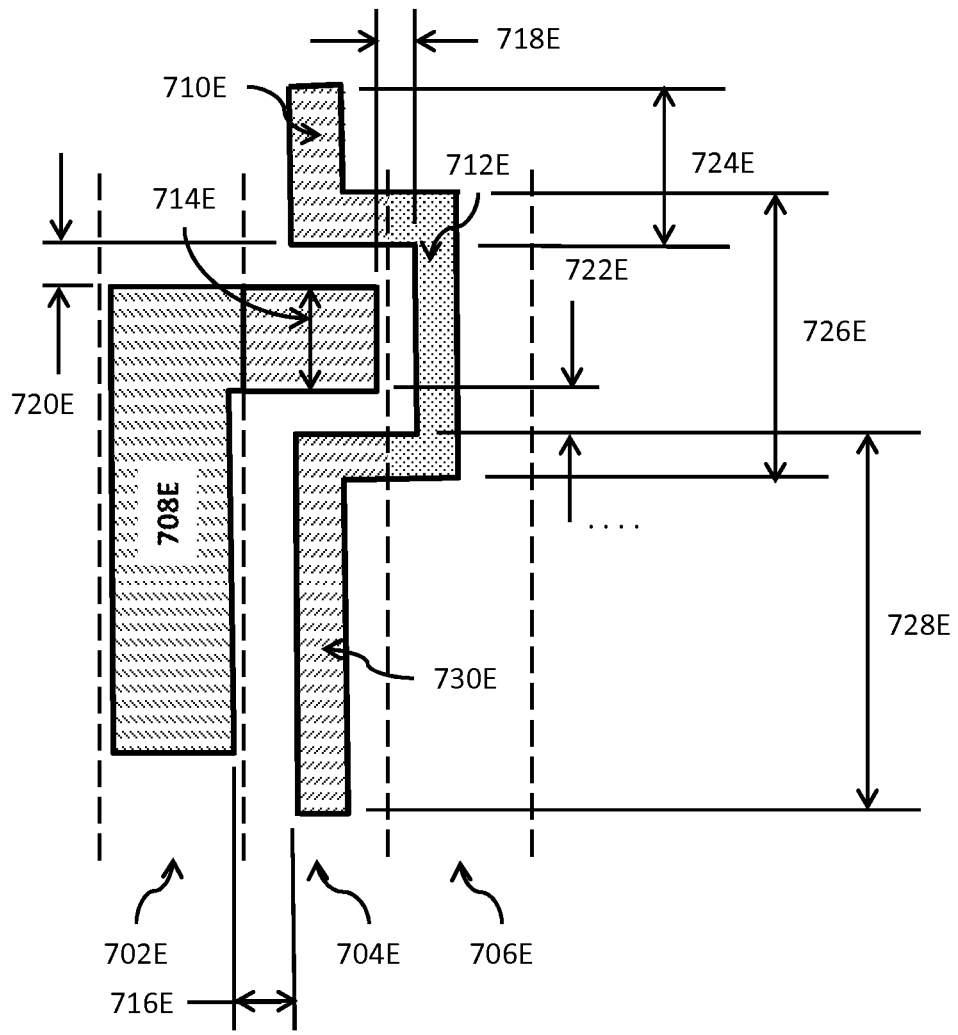

FIG. 7E continues from FIG. 7C by showing three routing tracks 702E, 704E, and 706E, where 702E and 706E are associated with the same first mask identification (not shown for clarity), and 704E is associated with a second mask identification (not shown for clarity). FIG. 7E further includes a second object 710E that is not designed to be connected with the first object (708E). FIG. 7E illustrates the second option for placing or routing the object 710E by making a first turn from routing track 704E into routing track 706E to avoid the first object 708E while maintaining a spacing 720E between 710E and 708E. As opposed to routing the object 710E straight down along routing track 706E, the method or the system may opt for making a second turn from the routing track 706E back into the routing track 704E while maintaining another spacing 722E between 708E and 710E and the other spacing 718E between 712E and 708E.

It shall be noted that the spacing 720E may or may not be identical to the spacing 722E, depending on whether the spacing constraint comprises a single value or is dependent upon the parallel run-length between two adjacent objects. For the first object 708E, the parallel run-length 714E indicates that there exists a color conflict between the portion indicated by 714E and the underlying routing track 704E. The method or the system may associate the entire second object 710E with the mask identification of routing track 704E in some embodiments where the parallel run-length 726E indicates a color conflict between the portion 712E of the second object with the underlying routing track 706E. The method or the system may associate the entire second object 710E with the mask identification of routing track 706E in some embodiments where the parallel run-lengths 724E and 728E indicates a color conflict between the portions 710E and 730E of the second object and the underlying routing track 704E. In this example illustrated in FIG. 7E, the color conflict indicated by 726E in the former option is less severe as the color conflict indicated by 728E and 724E and thus may be preferable in this specific example.

In some embodiments where an objective function or a cost function is employed, the method or the system may assess a more severe penalty or higher cost with the color conflict indicated by 724E and 730E and a less severe penalty or lower cost with the color conflict indicated by 726E. In some embodiments, the penalty or the cost may correspond to the parallel run-lengths of the object in color conflict. The method or the system may make a third turn for the second object to route the portion 730E within the routing track 704E while maintaining a spacing 716E between the portion 730E of the second object and the first object 708E. It shall be noted that in the example illustrated in FIG. 7E, the method or system uses the parallel run-lengths along the routing track direction to assess the severity of color conflicts. Nonetheless, the method or the system may also use other metrics for such severity assessment. For example, the metrics may comprise the area of the portion of an object in color conflict, the linear length (including one or more bends) of an object in color conflict, etc.

In some embodiments where splitting an object into multiple portions and stitching the multiple portions together is permitted, the method or the system may split the second object into three portions—710E, 712E, and 730E—and associate the portions 710E and 730E with the mask identification of the routing track 704E and the portion 712E with the mask identification of the routing track 706E to completely avoid color conflict. In some embodiments where the method or system further modifies, for example, first segment where 730E points to, second segment where 710E points to, or both such that a characteristic associated with the first segment and the second segment with respect to the third segment where 712E points to changes, the method or system may associate the second object 710E with the mask identification of the routing track 706E, instead of that of the routing track 704E in order to reduce color conflict. For example, if the method or the system performs a modification process on the first segment, the second segment, or both such that the overall length of the first and the second segment is shorter than that of the third segment, associating the second object with the mask identification of routing track 706E results in a less severe color conflict that exists between the routing track 704E and the first segment and between the routing track 704E and the segment due to the modification process.

Figure 7F:
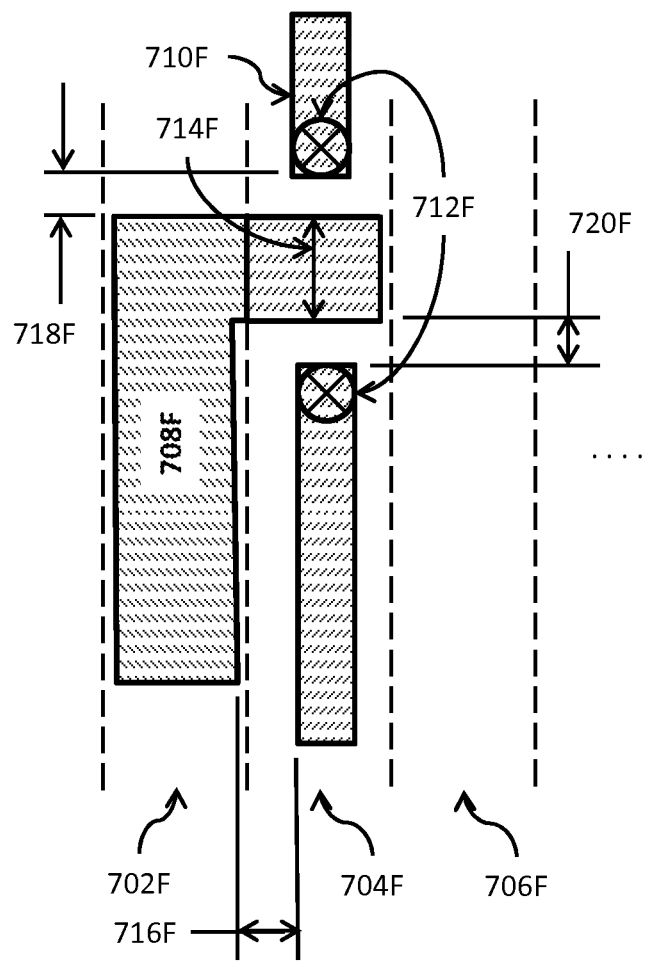

FIG. 7F continues from FIG. 7C and illustrates three routing tracks 702F, 704F, and 706F where the routing tracks 702F and 706F are associated with the first mask identification, and the routing track 704F is associated with the second mask identification. FIG. 7F further illustrates a first object 708F that partially occupies the routing tracks 702F and 704F. Depending upon whether splitting and stitching is permitted, there may or may not exist a color conflict indicated by 714F. In this example illustrated by FIG. 7F, the method or the system may use two drop vias 712F that are placed to maintain the spacing 716F, 718F, and 720F between the first object 708F and the second object 710F.

In this example illustrated in FIG. 7F, the method or the system may identify or determine a second mask identification scheme for the second plurality of routing tracks for the second layer in a completely independent manner of the first mask identification scheme for the first plurality of routing tracks of the first layer while attempting to reduce color conflicts in the first layer, the second layer, or both layers in some embodiments. In these embodiments, the second mask identification scheme may be identified or determined completely independent from that of the first mask identification scheme for the first layer such that the location of one or both drop vias 712F on the first layer falls within one or more routing tracks on the second layer with the same mask identification as the mask identification of the routing track 704F, which is the same as that of the drop vias 712F on the first layer.

When the method and the system associates the mask identification of the routing track 704F with the second object 710F and the two drop vias 712F, there may exist some color conflict between the second layer interconnect connecting the two drop vias 712F on the second layer and some of the routing tracks on the second layer, which may be oriented in a direction that is orthogonal to the orientation of the plurality of routing tracks on the first layer. For example, the routing tracks on the second layer may be in the horizontal direction that is orthogonal to the orientation of the routing tracks on the first layer. In this example, unless both drop vias 712F is projected with one routing track on the second layer, the interconnect connecting the two drop vias on the second layer may cause some color conflict in a dual-mask approach where two adjacent routing tracks are associated with different mask identifications. In some of these embodiments, the mask identification process for the routing tracks on the second layer may be completely independent of that of the routing track on the first layer in that the drop via locations on the first layer are identified in such a way while the method or system attempts to reduce conflicts (e.g., color conflict or mask conflict).

Figure 7G:
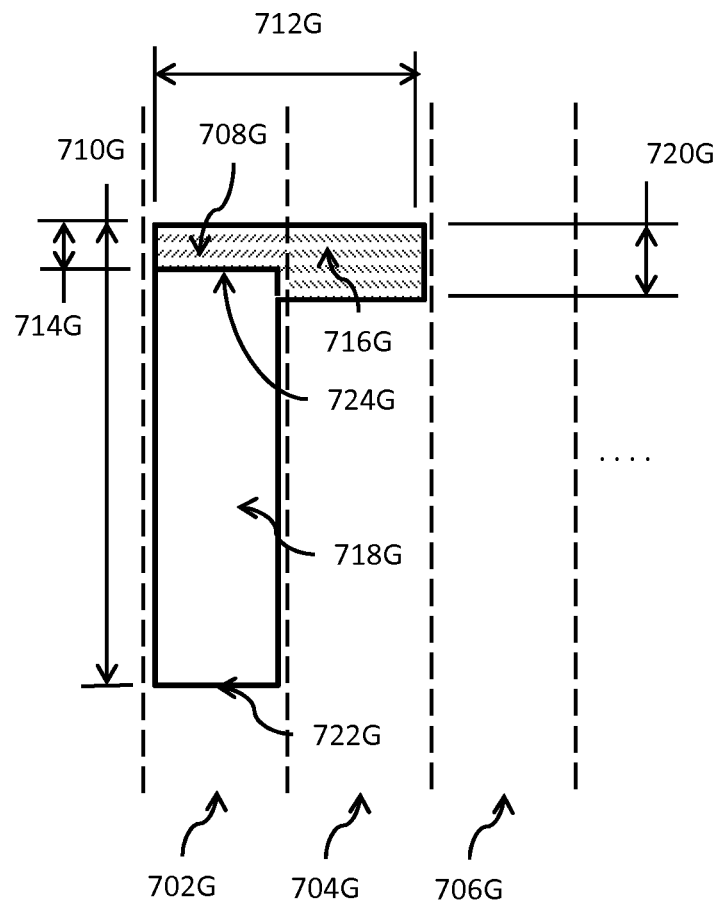

FIG. 7G illustrates an example where a modification of an object results in a change in mask identification of the object in some embodiments. More specifically, FIG. 7G illustrates three routing tracks 702G, 704G, and 706G where the routing tracks 702G and 706G are associated with the first mask identification, and the routing track 704G is associated with the second mask identification. The overall width of the objects 708G and 716G is designated as 712G in FIG. 7G. FIG. 7G further illustrates that the entire object (including 708G, 716G, and 718G) may be originally associated with the mask identification of the routing track 702G due to the fact that the parallel run-length 710G along the routing track 702G is greater than 720G along the routing track 704G. If there is a modification process that moves the edge 722G to 724G such that the parallel run-length 720G along the routing track 704G is now greater than 714G along the routing track 702G, the method or the system may automatically re-associate the object (including 708G and 716G after the modification process) with the mask identification of the routing track 704G to minimize color conflict. After the re-association, the color conflict now exists between the portion 708G of the object and the routing track 702G.

Figure 8:
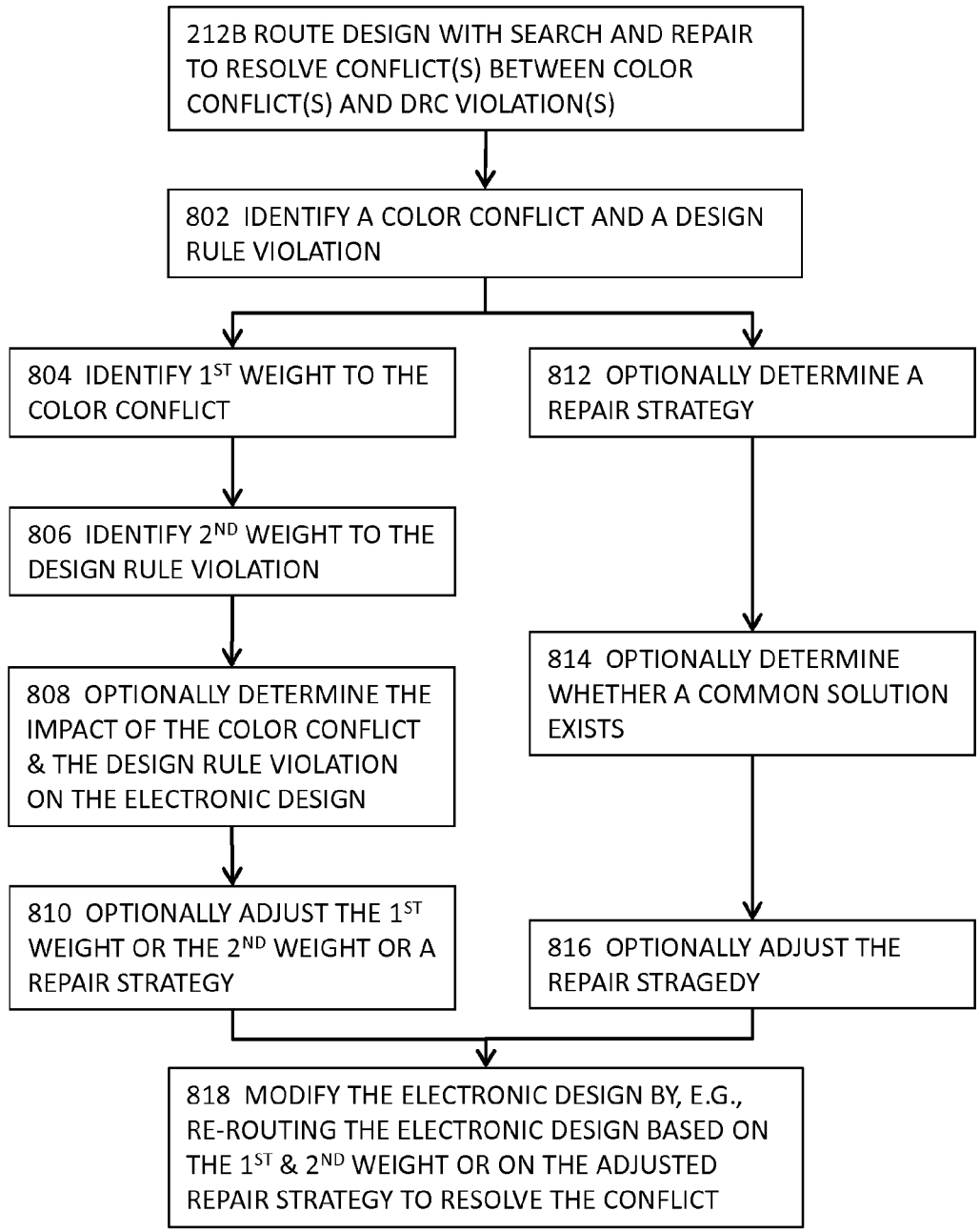
FIG. 8 illustrates a more detailed flow diagram for implementing a physical electronic design with multiple-patterning technique awareness in some embodiments.

FIG. 8 illustrates a more detailed flow diagram the sub-process or sub-module the sub-process or sub-module 212B illustrated in FIG. 2B in some embodiments. In some embodiments, the process or module 212B of performing routing on at least a portion of the physical electronic circuit design to resolve or to improve one or more conflicts between color conflicts and DRC violations may comprise the sub-process or sub-module 802 of identifying a color conflict and a design rule violation. In some embodiments, the process or module 212B of resolving one or more conflicts between color conflicts and DRC violations may comprise the sub-process or sub-module 804 of identifying a first weight to the color conflict or to the constraint causing the color conflict and the sub-process or sub-module 806 of identifying a second weight to the design rule or the violation thereof. In some of these embodiments, the process or module 212B of resolving one or more conflicts between color conflicts and DRC violations may optionally comprise the sub-process or sub-module 808 of determining the respective impact of the color conflict and the design rule violation on the electronic circuit design.

In some embodiments, the process or module 2128 of resolving one or more conflicts between color conflicts and DRC violations may further optionally comprise the sub-process or sub-module 810 of adjusting the first weight for the color conflict or the constraint causing the color conflict or the second weight for the design rule or the violation thereof. In some embodiments, the process or module 212B of resolving one or more conflicts between color conflicts and DRC violations may further optionally comprise the sub-process or sub-module 810 of adjusting a repair strategy based at least in part upon the determination of respective impact of the color conflict and of the design rule violation. In some embodiments, the process or module 212B of resolving one or more conflicts between color conflicts and DRC violations may comprise the sub-process or sub-module 818 of modifying the electronic circuit design based at least in part upon the first weight for the color conflict or the constraint causing the color conflict and the second weight for the design rule or the violation thereof. In some embodiments, the process or module may modify the electronic circuit design by performing, for example but not limited to, rip-up and re-route on at least a portion of the electronic circuit design based at least in part upon the first weight for the color conflict or the constraint causing the color conflict and the second weight for the design rule or the violation thereof.

In some embodiments, the process or module 2128 of resolving one or more conflicts between color conflicts and DRC violations may comprise the sub-process or sub-module 818 of modifying the electronic circuit design based at least in part upon an adjusted repair strategy that has been adjusted based at least in part on the determination of the respective impact of the color conflict and the design rule violation. For example, if the method or the system determines that the severity of the color conflict is less than that of the design rule violation, the method or the system may increase the second weight or decrease the first weight or may adjust the repair strategy to associate a higher priority with the repair of the design rule violation or a lower priority with the repair of the color conflict.

In some alternative embodiments, the process or module 212B of resolving one or more conflicts between color conflicts and DRC violations may optionally comprise the sub-process or sub-module 812 of determining a repair strategy after the performance of the sub-process or sub-module 802. In these embodiments, the process or module 2128 of resolving one or more conflicts between color conflicts and DRC violations may optionally comprise the sub-process or sub-module 814 of determining whether a common solution exists that addresses both the color conflict and the design rule violation. In these embodiments, the method or the system may also optionally comprise the sub-process or sub-module 816 of adjusting a repair strategy based at least in part upon the determination result of whether a common solution exists. In these embodiments, the process or module 212B of resolving one or more conflicts between color conflicts and DRC violations may also proceed to 818 to modify the electronic circuit design based at least in part upon the adjusted repair strategy.

System Architecture Overview

Figure 9:
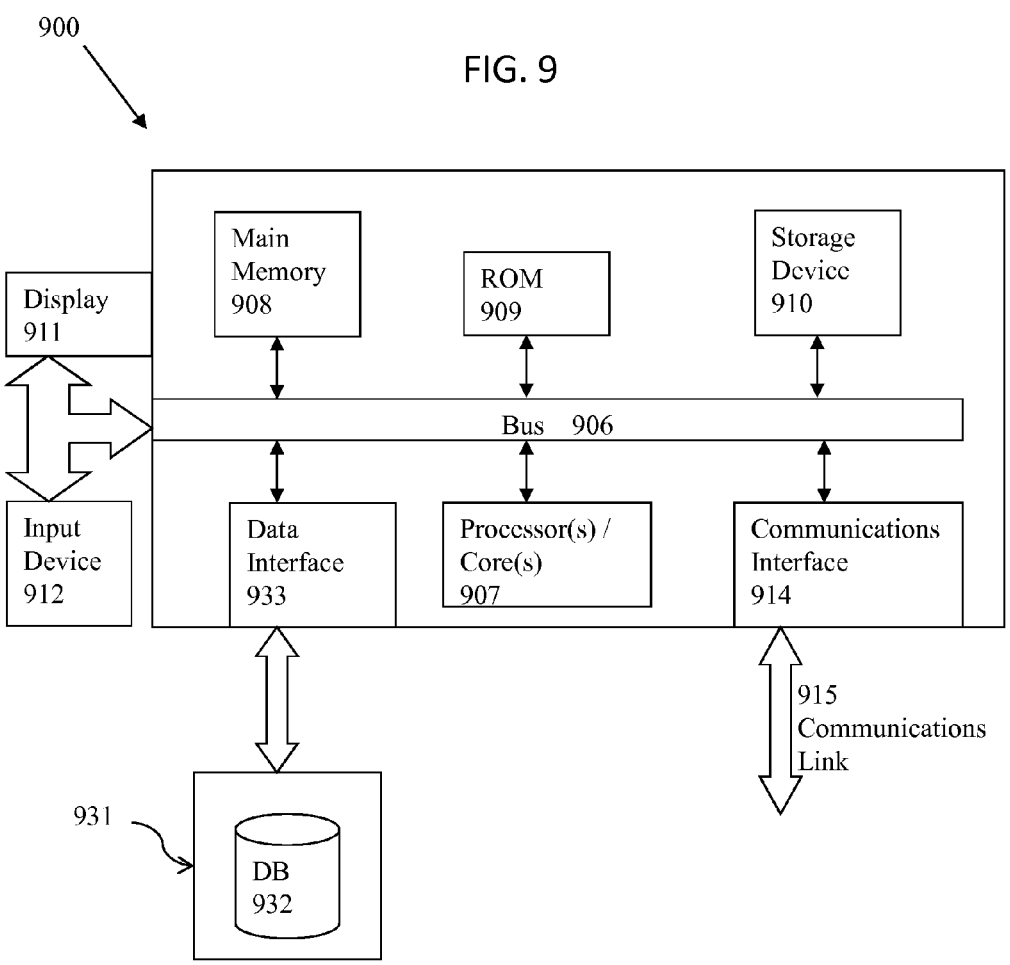
FIG. 9 illustrates a computerized system on which a method for implementing a physical electronic design with multiple-patterning techniques may be implemented.

FIG. 9 illustrates a block diagram of an illustrative computing system 900 suitable for implementing a physical electronic circuit design with multiple-patterning techniques as described in the preceding paragraphs with reference to various figures. Computer system 900 includes a bus 906 or other communication mechanism for communicating information, which interconnects subsystems and devices, such as processor 907, system memory 908 (e.g., RAM), static storage device 909 (e.g., ROM), disk drive 910 (e.g., magnetic or optical), communication interface 914 (e.g., modem or Ethernet card), display 911 (e.g., CRT or LCD), input device 912 (e.g., keyboard), and cursor control (not shown).

According to one embodiment, computer system 900 performs specific operations by one or more processor or processor cores 907 executing one or more sequences of one or more instructions contained in system memory 908. Such instructions may be read into system memory 908 from another computer readable/usable storage medium, such as static storage device 909 or disk drive 910. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 907, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 900. According to other embodiments of the invention, two or more computer systems 900 coupled by communication link 915 (e.g., LAN, PTSN, or wireless network) may perform the sequence of instructions required to practice the invention in coordination with one another.

Computer system 900 may transmit and receive messages, data, and instructions, including program, i.e., application code, through communication link 915 and communication interface 914. Received program code may be executed by processor 907 as it is received, and/or stored in disk drive 910, or other non-volatile storage for later execution. In an embodiment, the computer system 900 operates in conjunction with a data storage system 931, e.g., a data storage system 931 that contains a database 932 that is readily accessible by the computer system 900. The computer system 900 communicates with the data storage system 931 through a data interface 933. A data interface 933, which is coupled to the bus 906, transmits and receives electrical, electromagnetic or optical signals that include data streams representing various types of signal information, e.g., instructions, messages and data. In embodiments of the invention, the functions of the data interface 933 may be performed by the communication interface 914.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing a physical electronic circuit design with multiple-patterning techniques, comprising:
   using at least one processor or at least one processor core to perform a process the process comprising:
   identifying a constraint for multiple mask designs of a multiple-patterning lithography process for manufacturing the electronic design;
   coloring a first plurality of routing tracks in the electronic design with a first number of colors;
   coloring one or more fixed objects in the electronic design with at least one color of the first number of colors based at least in part upon a result of coloring the first plurality of routing tacks with the first number of colors; and
   improving or resolving a color conflict in the electronic design based at least in part upon a characteristic of at least a part of an object that exhibits the color conflict with at least one of another object, wherein the characteristic comprises a one-dimensional size or a two-dimensional size of the at least the part of the object.

2. The computer implemented method of claim 1, the process further comprising:
   routing at least a portion of the electronic design based at least in part upon a first result of coloring the first plurality of routing tracks or a second result of coloring the one or more fixed objects; and
   coloring one or more movable objects in the electronic design based at least in part upon a result of coloring the one or more fixed objects.

3. The computer implemented method of claim 2, the process further comprising:
   detecting a multiple-patterning conflict between a plurality of physical design components based at least in part upon the second result of coloring the one or more fixed objects, a third result of coloring the one or more movable objects, or routing connectivity.

4. The computer implemented method of claim 2, the process further comprising:
   performing global or detail routing on the at least a portion of the electronic design to improve or resolve a color conflict in the electronic design.

5. The computer implemented method of claim 4, in which the global or detail routing is performed with a search and repair strategy, wherein the color conflict comprises a situation where a color of the object is different from a color of an underlying routing track, at least part of which is occupied by the object.

6. The computer implemented method of claim 4, the action of reducing the color conflict comprising:
   identifying the object that exhibits the color conflict from the one or more fixed objects or from the one or more movable objects;
   identifying or determining the characteristic of the object;
   identifying or determining an objective function for the color conflict based at least in part upon the characteristic of the object; and
   reducing the color conflict by using at least the objective function.

7. The computer implemented method of claim 6, wherein the characteristic comprises a parallel run-length of at least a portion of the object, a linear length or width of the at least the portion of the object, or an area of the at least the portion of the object.

8. The computer implemented method of claim 1, the process further comprising:
   identifying or creating a partial, incomplete physical design of the electronic design that includes at least one object that is undergoing a physical design process, wherein
   the physical design process includes at least one of a floorplanning process for the at least one object, a placement process for the at least one object, a global routing process for the at least one object, and a detail routing process for the at least one object.

9. The computer implemented method of claim 8, wherein the action of identifying the partial, incomplete physical design of the electronic design comprises:
   identifying connectivity information or data from a schematic design of the electronic design;
   identifying or creating the at least one object upon which the physical design process is to be performed;
   identifying one or more nets from the connectivity information or data for the at least one object upon which the physical design process is to be performed; and identifying one or more other objects for the at least one object with a range of influence.

10. The computer implemented method of claim 1, the action of coloring the first plurality of routing tracks further comprising:
identifying the first plurality of routing tracks on a first layer of the electronic design;
identifying or determining one or more first constraints between two or more adjacent objects that occupy at least a part of the first plurality of routing tracks;
identifying a first number of mask designs for manufacturing the first layer of the electronic design with the multiple-patterning lithography process;
dividing the first plurality of routing tracks into a first number of sets of routing tracks, wherein the first number of mask designs is identical to the first number of sets; and
associating a first set of the first number of sets of routing tracks with a first unique mask identification.

11. The computer implemented method of claim 10, wherein the action of associating the first set of the first number of sets of routing tracks with the unique mask identification comprises:
identifying or creating a second plurality of routing tracks on a second layer;
identifying or determining the one or more first constraints or one or more second constraints between two or more adjacent objects that occupy at least a part of the second plurality of routing tracks on the second layer;
identifying a second number of mask designs that are to be used for manufacturing the second layer of the electronic design;
dividing the second plurality of routing tracks into a second number of sets, wherein the second number of mask designs is identical to the second number of sets; and
associating a second set of the second number of sets of routing tracks with a second unique mask identification.

12. The computer implemented method of claim 11, wherein the process further comprising one of:
coloring the second plurality of routing tracks of the second layer independently from the first plurality of routing tracks of the first layer; and
coloring the second plurality of routing tracks of the second layer based at least in part upon a result of the action of coloring the first plurality of routing tracks.

13. The computer implemented method of claim 11, wherein the one or more first constraints or the one or more second constraints comprise at least one of a corner-to-corner constraint, a net-to-net constraint, and a voltage-based constraint between two or more objects in the electronic design.

14. The computer implemented method of claim 1, wherein the action of coloring the one or more fixed objects in the electronic design comprises:
identifying or creating one or more fixed objects in the electronic design;
identifying or determining one or more corresponding mask identifications for the one or more fixed objects, wherein the one or more corresponding mask identifications for the one or more fixed objects are fixed;
identifying or creating a first fixed object from the one or more fixed objects and a corresponding first mask identification for the first fixed object;
determining whether the corresponding first mask identification is to be altered; and
associating a different mask identification with the first fixed object based at least in part upon a result of the action of determining whether the corresponding first mask identification is to be altered.

15. The computer implemented method of claim 3, wherein the action of coloring the one or more movable objects comprises:
identifying or creating a movable object of the one or more movable objects in the electronic design;
identifying or generating one or more routing tracks related to the movable object; and
identifying or determining one or more corresponding mask identifications of the one or more routing tracks.

16. The computer implemented method of claim 15, wherein the action of coloring the one or more movable objects further comprises:
identifying or determining an objective function based at least in part upon one or more factors; and
associating the movable object with a mask identification by using at least the objective function and the one or more corresponding mask identifications of the one or more routing tracks.

17. The computer implemented method of claim 16, the one or more factors comprising at least one of a parallel run-length in color conflict of at least a portion of the movable object, a linear length in color conflict of the at least a portion of the movable object, an area in color conflict of the at least a portion of the movable object, an electrical effect affecting mask identification for the movable object, a parasitic effect affecting the mask identification for the movable object, and an penalty assessed for color conflict.

18. The computer implemented method of claim 3, the process further comprising:
resolving a conflict between the color conflict and a constraint violation.

19. The computer implemented method of claim 18, the process further comprising:
associating the color conflict with a first weight;
associating the constraint violation with a second weight;
identifying or determining a repair strategy;
adjusting the repair strategy based at least in part upon the first weight and the second weight; and
modifying the electronic design based at least in part upon the repair strategy that is adjusted.

20. The computer implemented method of claim 19, the process further comprising:
determining whether a common solution for the color conflict and the constraint violation exists; and
adjusting the repair strategy based at least in part upon the common solution, where the common solution is determined to exist.

21. An article of manufacture comprising a non-transitory computer readable storage medium having a sequence of instructions stored thereupon which, when executed by at least one processor or at least one processor core, causes the at least one processor or the at least one processor core to perform a method for implementing a physical electronic circuit design with multiple-patterning techniques, the method comprising:
using the at least one processor or at least one processor core to perform a process, the process comprising:
identifying a constraint for multiple mask designs of a multiple-patterning lithography process for manufacturing the electronic design;
coloring a first plurality of routing tracks in the electronic design with a first number of colors;
coloring one or more fixed objects in the electronic design with at least one color of the first number of colors based at least in part upon a result of coloring the first plurality of routing tacks with the first number of colors; and improving or resolving a color conflict in the electronic design based at least in part upon a characteristic of at least a part of an object that exhibits the color conflict with at least one of another object, wherein the characteristic comprises a one-dimensional size or a two-dimensional size of the at least the part of the object.

22. The article of manufacture of claim 21, the process further comprising:

coloring one or more movable objects in the electronic design based at least in part upon a result of coloring the one or more fixed objects; and reducing color conflict in the electronic design, wherein the color conflict comprises a situation where a color of the object is different from a color of an underlying routing track, at least part of which is occupied by the object.

23. The article of manufacture of claim 22, the action of reducing the color conflict comprising:

identifying or creating an object that exhibits the color conflict from the one or more fixed objects or from the one or more movable objects;

identifying or determining the characteristic of the object;

identifying or determining an objective function for the color conflict based at least in part upon the characteristic of the object; and reducing the color conflict by using at least the objective function, wherein the characteristic comprises a parallel run-length of at least a portion of the object in one or more routing tracks, a linear length of the at least the portion of the object in the one or more routing tracks, or an area of the at least the portion of the object in the one or more routing tracks.

24. The article of manufacture of claim 21, the process further comprising:

identifying or creating a partial, incomplete physical design of the electronic design that includes at least one object that is undergoing a physical design process, wherein the physical design process includes at least one of a floorplanning process for the at least one object, a placement process for the at least one object, a global routing process for the at least one object, and a detail routing process for the at least one object;

identifying connectivity information or data from a schematic design of the electronic design;

identifying or creating the at least one object upon which the physical design process is to be performed;

identifying one or more nets from the connectivity information or data for the at least one object upon which the physical design process is to be performed; and identifying or creating one or more other objects for the at least one object with a range of influence.

25. The article of manufacture of claim 21, the action of coloring the first plurality of routing tracks further comprising:

identifying or creating the first plurality of routing tracks on a first layer of the electronic design;

identifying or determining one or more first constraints between two or more adjacent objects that occupy at least a part of the first plurality of routing tracks;

identifying a first number of mask designs for manufacturing the first layer of the electronic design with the multiple-patterning lithography process;

dividing the first plurality of routing tracks into a first number of sets of routing tracks, wherein the first number of mask designs is identical to the first number of sets; and associating a first set of the first number of sets of routing tracks with a first unique mask identification.

26. The article of manufacture of claim 21, wherein the action of coloring the one or more fixed objects in the electronic design comprises:

identifying or creating one or more fixed objects in the electronic design;

identifying or determining one or more corresponding mask identifications for the one or more fixed objects, wherein the one or more corresponding mask identifications for the one or more fixed objects are fixed;

identifying or creating a first fixed object from the one or more fixed objects and a corresponding first mask identification for the first fixed object;

determining whether the corresponding first mask identification is to be altered; and associating a different mask identification with the first fixed object based at least in part upon a result of the action of determining whether the corresponding first mask identification is to be altered.

27. The article of manufacture of claim 22, wherein the action of coloring the one or more movable objects comprises:

identifying or creating a movable object of the one or more movable objects in the electronic design;

identifying or creating one or more routing tracks related to the movable object;

identifying or determining one or more corresponding mask identifications of the one or more routing tracks;

identifying or determining an objective function based at least in part upon one or more factors, wherein the one or more factors comprise at least one of a parallel run-length in color conflict of at least a portion of the movable object, a linear length in color conflict of the at least a portion of the movable object, an area in color conflict of the at least a portion of the movable object, an electrical effect affecting mask identification for the movable object, a parasitic effect affecting the mask identification for the movable object, and an penalty assessed for color conflict; and associating the movable object with a mask identification by using at least the objective function and the one or more corresponding mask identifications of the one or more routing tracks.

28. A system for implementing a physical electronic design of an electronic circuit using one or more constraint checking windows, comprising:

at least one processor or at least one processor core that is to:

identify a constraint for multiple mask designs of a multiple-patterning lithography process for manufacturing the electronic design;

color a first plurality of routing tracks in the electronic design with a first number of colors;

color one or more fixed objects in the electronic design with at least one color of the first number of colors based at least in part upon a result of coloring the first plurality of routing tacks with the first number of colors; and improve or resolving a color conflict in the electronic design based at least in part upon a characteristic of at least a part of an object that exhibits the color conflict with at least one of another object, wherein the characteristic comprises a one-dimensional size or a two-dimensional size of the at least the part of the object.

29. The system of claim 28, the at least one processor or the at least one processor core is further to:

color one or more movable objects in the electronic design based at least in part upon a result of coloring the one or more fixed objects; and reduce color conflict in the electronic design, wherein the color conflict comprises a situation where a color of the object is different from a color of an underlying routing track, at least part of which is occupied by the object.

30. The system of claim 29, the at least one processor or the at least one processor core that is to reduce the color conflict is further to:

identify or create an object that exhibits the color conflict from the one or more fixed objects or from the one or more movable objects;

identify or determine the characteristic of the object;

identify or determine an objective function for the color conflict based at least in part upon the characteristic of the object; and reduce the color conflict by using at least the objective function, wherein the characteristic comprises a parallel run-length of at least a portion of the object in one or more routing tracks, a linear length of the at least the portion of the object in the one or more routing tracks, or an area of the at least the portion of the object in the one or more routing tracks.

31. The system of claim 28, the at least one processor or the at least one processor core is further to:

identify or generate a partial, incomplete physical design of the electronic design that includes at least one object that is undergoing a physical design process, wherein the physical design process includes at least one of a floor-planning process for the at least one object, a placement process for the at least one object, a global routing process for the at least one object, and a detail routing process for the at least one object;

identify or determine connectivity information or data from a schematic design of the electronic design;

identify or create the at least one object upon which the physical design process is to be performed;

identify one or more nets from the connectivity information or data for the at least one object upon which the physical design process is to be performed; and identify or create one or more other objects for the at least one object with a range of influence.

32. The system of claim 28, the at least one processor or the at least one processor core that is to color the first plurality of routing tracks is further to:

identify or create the first plurality of routing tracks on a first layer of the electronic design;

identify or determine one or more first constraints between two or more adjacent objects that occupy at least a part of the first plurality of routing tracks;

identify a first number of mask designs for manufacturing the first layer of the electronic design with the multiple-patterning lithography process;

divide the first plurality of routing tracks into a first number of sets of routing tracks, wherein the first number of mask designs is identical to the first number of sets; and associate a first set of the first number of sets of routing tracks with a first unique mask identification.

33. The system of claim 28, wherein the at least one processor or the at least one processor core that is to color the one or more fixed objects in the electronic design is further to:

identify or create one or more fixed objects in the electronic design;

identify or determine one or more corresponding mask identifications for the one or more fixed objects, wherein the one or more corresponding mask identifications for the one or more fixed objects are fixed;

identify or create a first fixed object from the one or more fixed objects and a corresponding first mask identification for the first fixed object;

determine whether the corresponding first mask identification is to be altered; and associate a different mask identification with the first fixed object based at least in part upon a result of the action of determining whether the corresponding first mask identification is to be altered.

34. The system of claim 29, wherein the at least one processor or the at least one processor core that is to color the one or more movable objects is further to:

identify or create a movable object of the one or more movable objects in the electronic design;

identify or determine one or more routing tracks related to the movable object;

identify or determine one or more corresponding mask identifications of the one or more routing tracks;

identify or determine an objective function based at least in part upon one or more factors, wherein the one or more factors comprise at least one of a parallel run-length in color conflict of at least a portion of the movable object, a linear length in color conflict of the at least a portion of the movable object, an area in color conflict of the at least a portion of the movable object, an electrical effect affecting mask identification for the movable object, a parasitic effect affecting the mask identification for the movable object, and an penalty assessed for color conflict; and associate the movable object with a mask identification by using at least the objective function and the one or more corresponding mask identifications of the one or more routing tracks.

* * * * *